United States Patent
McKinzie, III

(10) Patent No.: US 9,472,838 B2
(45) Date of Patent: Oct. 18, 2016

(54) ABSORPTIVE ELECTROMAGNETIC SLOW WAVE STRUCTURES

(71) Applicant: WEMTEC, INC., Fulton, MD (US)

(72) Inventor: William E. McKinzie, III, Fulton, MD (US)

(73) Assignee: WEMTEC, INC., Fulton, MD (US)

( * ) Notice: Subject to any disclaimer, the term of this patent is extended or adjusted under 35 U.S.C. 154(b) by 0 days.

(21) Appl. No.: 14/635,477

(22) Filed: Mar. 2, 2015

(65) Prior Publication Data

US 2015/0214595 A1    Jul. 30, 2015

Related U.S. Application Data

(62) Division of application No. 13/313,409, filed on Dec. 7, 2011, now Pat. No. 9,024,706.

(60) Provisional application No. 61/626,211, filed on Sep. 22, 2011, provisional application No. 61/463,718, filed on Feb. 22, 2011, provisional application No. 61/459,231, filed on Dec. 9, 2010.

(51) Int. Cl.
| | |
|---|---|
| *H01P 1/20* | (2006.01) |
| *H01Q 15/10* | (2006.01) |
| *H01P 3/00* | (2006.01) |
| *H01Q 25/00* | (2006.01) |
| *H05K 1/02* | (2006.01) |

(52) U.S. Cl.
CPC ............ *H01P 3/003* (2013.01); *H01P 1/2005* (2013.01); *H01Q 15/10* (2013.01); *H01Q 25/008* (2013.01); *H05K 1/0236* (2013.01); *Y10T 29/49016* (2015.01)

(58) Field of Classification Search
CPC .......... H01P 1/2005; H01P 1/16; H01P 1/20; H01Q 15/008; H01Q 3/46; H01Q 15/10; H05K 1/0236; H05K 1/0234
USPC ................................ 333/251, 175, 157, 248
See application file for complete search history.

(56) References Cited

U.S. PATENT DOCUMENTS

| | | | |
|---|---|---|---|
| 3,761,936 A | 9/1973 | Archer et al. | |
| 6,897,831 B2 | 5/2005 | McKinzie, III et al. | |
| 6,906,674 B2 | 6/2005 | McKinzie, III et al. | |
| 7,215,007 B2 * | 5/2007 | McKinzie, III | ........... H01P 1/16 257/664 |

(Continued)

OTHER PUBLICATIONS

E.O.Rausch et al., "Theory and Measurements of a Compact High Dielectric Microstrip Rotman Lens", Elect. Eng. Department, Georgia Institute of Technology, European Microwave Con. 1992, pp. 876-881.

(Continued)

*Primary Examiner* — Dean Takaoka
*Assistant Examiner* — Alan Wong
(74) *Attorney, Agent, or Firm* — Brinks Gilson & Lione

(57) ABSTRACT

Electromagnetic slow wave structures (SWS) comprised of arrays of conductive obstacles are formed inside conductive parallel-plate waveguides These SWS may be formed using, for example, MEMS manufacturing processes at the wafer level on substrates including ceramic and silicon. An effective relative permittivity in the range of 15 to 40 may be obtained at millimeterwave frequencies. The SWS can be made absorptive by incorporating resistive losses in a plate of the PPW. Applications of these slow wave structures include delay lines and bootlace lens beamformers for microwave and millimeterwave antenna systems.

21 Claims, 32 Drawing Sheets

(a)

(b)

(c)

(d)

(56) References Cited

U.S. PATENT DOCUMENTS

| | | | |
|---|---|---|---|
| 7,626,216 B2* | 12/2009 | McKinzie, III | H01P 1/20 |
| | | | 257/192 |
| 7,936,310 B2 | 5/2011 | Aiga et al. | |
| 8,514,036 B2 | 8/2013 | McKinzie, III | |
| 8,803,738 B2* | 8/2014 | Nguyen | H01Q 15/08 |
| | | | 343/700 MS |
| 8,816,798 B2 | 8/2014 | McKinzie, III | |
| 9,024,706 B2* | 5/2015 | McKinzie, III | H01P 1/2005 |
| | | | 333/157 |
| 2002/0167456 A1 | 11/2002 | McKinzie, III | |
| 2006/0044210 A1 | 3/2006 | Ramprasad et al. | |

OTHER PUBLICATIONS

Lora Schulwitz et al., "A New Low Loss Rotman Lens Design Using a Graded Dielectric Substrate", IEEE Transactions on Microwave Theory and Techniques, vol. 56, No. 12, Dec. 2008 pp. 2734-2741.

Aldo Petosa et al., "Array of Perforated Dielectric Resonator Antennas", IEEE Antennas and Propagation Intl. Symposium, Monterey, CA, Jun. 2004, pp. 1106-1109.

* cited by examiner

Fig 8.

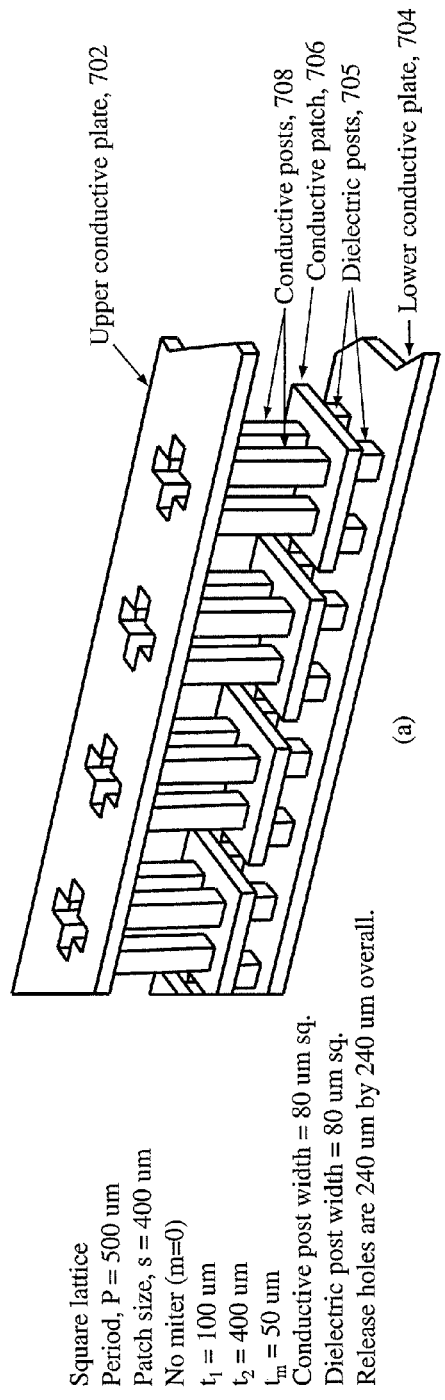

Upper conductive plate, 702
Conductive posts, 708
Conductive patch, 706
Dielectric posts, 705
Lower conductive plate, 704

Square lattice
Period, P = 500 um
Patch size, s = 400 um
No miter (m=0)
$t_1$ = 100 um
$t_2$ = 400 um
$t_m$ = 50 um
Conductive post width = 80 um sq.
Dielectric post width = 80 um sq.
Release holes are 240 um by 240 um overall.

(a)

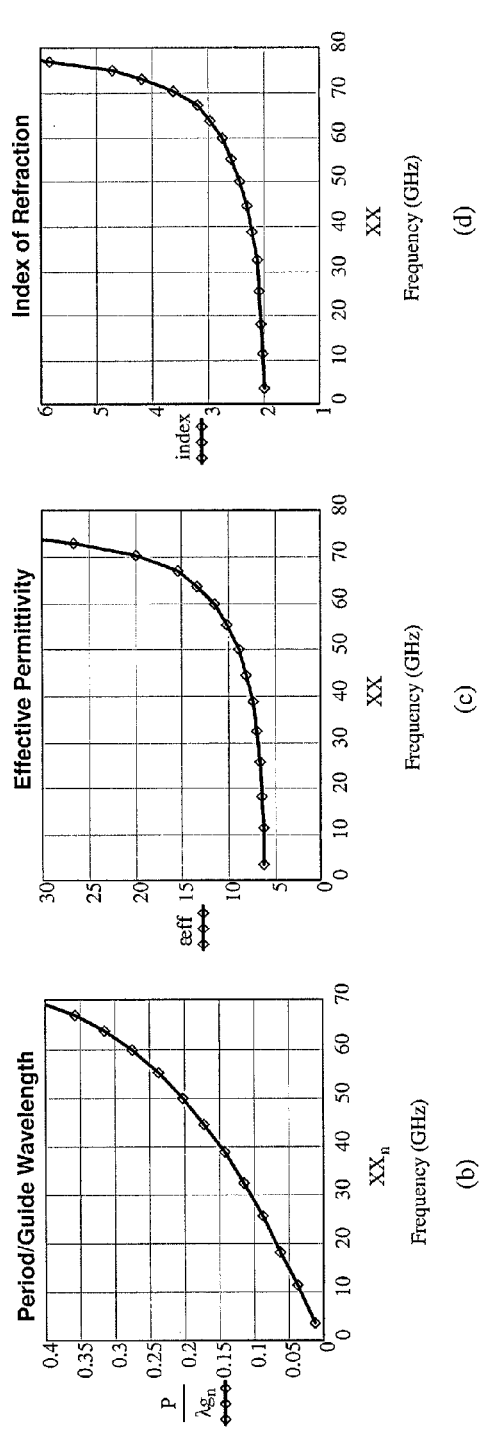

(b) Period/Guide Wavelength vs Frequency (GHz)

(c) Effective Permittivity vs Frequency (GHz)

(d) Index of Refraction vs Frequency (GHz)

FIG. 17
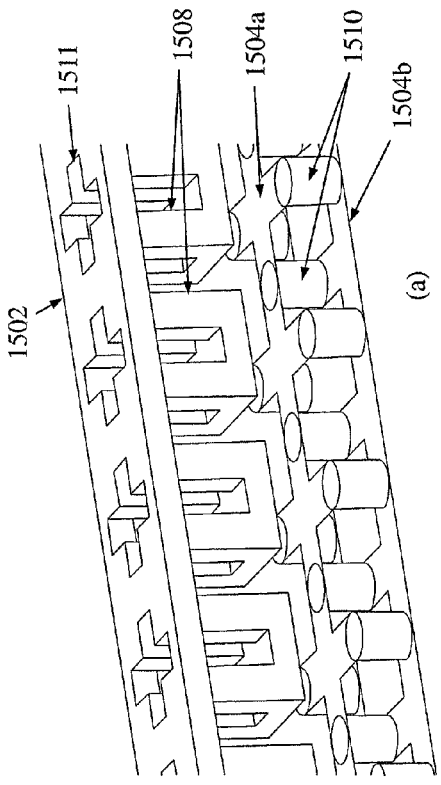
Square lattice with period P = 300 um
Patch size: s = 210 um with no miter
$t_1$ = 100 um
$t_2$ = 150 um
$t_3 = t_m$ = 50 um
b = c = 70 um
$w_1 = w_2$ = 90 um
Via dia. in ceramic: 2r = 90 um
Via length in substrate: $t_4$ = 100 um
Substrate permittivity: $\varepsilon_r$ = 7.1
Release holes are 210 um x 210 um overall
(a)
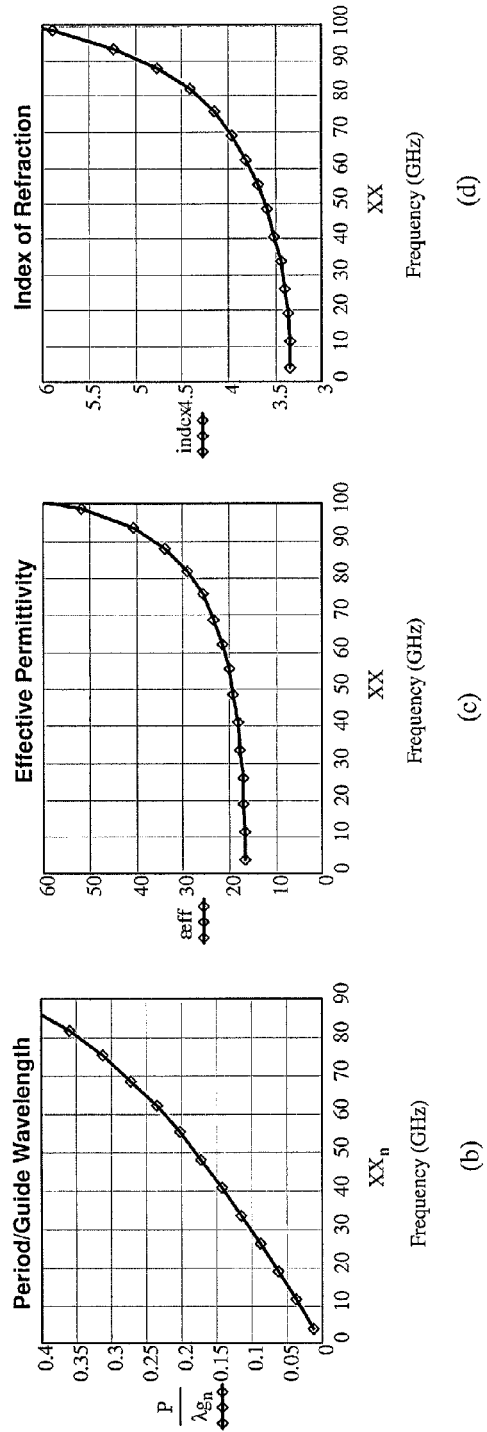
(d)
(c)
(b)

ABSORPTIVE ELECTROMAGNETIC SLOW WAVE STRUCTURES

The present application is a divisional application of U.S. Ser. No. 13/313,409, filed on Dec. 7, 2011, which claims the benefit of priority to U.S. provisional application Ser. No. 61/626,211, filed on Sep. 22, 2011, to U.S. provisional application Ser. No. 61/463,718, filed on Feb. 22, 2011 and to U.S. provisional application Ser. No. 61/459,231, filed on Dec. 12, 2010, each of which are incorporated in their entirety herein by reference.

TECHNICAL FIELD

This application may relate to electromagnetic slow wave structures formed in parallel plate waveguides (PPWs).

BACKGROUND

In electronic systems it is often desirable to reduce the physical volume or area required to implement a given signal processing function. An example is a lens-based antenna beamformer. The area required in a beamforming lens can be dozens to hundreds of square wavelengths depending on the antenna array size and number of beam ports. To reduce the physical size of a beamforming lens without sacrificing its electrical dimensions, the electromagnetic propagation velocity within the lens must be slowed relative to the speed of light in free space. Antenna designers have historically used various dielectric materials to fill parallel plate waveguides used as lenses. [See for example D. H. Archer et. al, U.S. Pat. No. 3,761,936, and E. O. Rauch, European Microwave Conference, 1992, pp. 876-881.] The relative permittivity is that of the host dielectric, which is often lower than about 6. This limits the potential size reduction to a factor of 6 in area, or $\sqrt{6}$ in linear dimensions. Conventional high dielectric materials are often too lossy, especially at high microwave and millimeterwave frequencies.

When using homogeneous microwave laminates the relative permittivity does not vary as a function of position or as a function of the direction of wave propagation within a waveguide that employs such a material. There are examples of inhomogeneous dielectric materials formed by drilling patterns of air-filled holes in an otherwise homogeneous dielectric slab [A. Petosa et. al., IEEE Antennas and Propagation Intl. Symposium, Monterey, Calif., June 2004, pp. 1106-1109, and L. Schulwitz, et. al, IEEE Trans. on Microwave Theory and Techniques, Vol. 56, No. 12, December 2008, pp. 2734-2741]. But, this method of engineering an inhomogeneous dielectric medium results in a decrease of the permittivity relative to the host dielectric.

Solid dielectric materials associated with microwave components formed using PPW or stripline also increase the weight or mass of the component. Conventional dielectric materials such as high-quality microwave laminates are usually manufactured separately as sheets and are typically clad with metal. Using such dielectric materials in higher-level assemblies may require etching, plating, drilling, bonding, soldering, and possibly other manufacturing operations. Very tight manufacturing tolerances are required for microwave and millimeterwave assemblies and packages that use conventional dielectric sheets. For antenna beamformer applications, the wave impedance of an absorptive structure used as a lens wall should be matched with the wave impedance of an interior region of the lens beamformer. This implies the need to match the ratio of effective permeability to effective permittivity on both sides of the wall interface.

SUMMARY

A slow wave structure (SWS) and manufacturing method for a SWS is disclosed. In an example, the SWS may comprise a parallel-plate waveguide (PPW) comprised of two conductive plates inside of which are disposed an array of conductive obstacles, where the shape of the conductive obstacles and the spacing between conductive obstacles and the host dielectric materials supporting the conductive obstacles are selected to achieve a desired effective permittivity at an operating frequency. The effective permittivity may exceed the permittivity of the host dielectric material used inside the PPW. For example, the effective relative permittivity may exceed 6 for an essentially air-filled SWS having conductive obstacles, and it may exceed 15 for a SWS fabricated with the same conductive structures on a silicon substrate.

In yet another example the conductive obstacles used in the SWS may be arrays of resonant vias of the type known as internal T, internal double-T, or internal-I.

In another aspect, a resonant via is comprised of a plurality of vias or posts in each unit cell of the structure may be used to reduce the effective shunt inductance so as to increase the useful bandwidth of the SWS.

In still another example, a slow wave structure may be comprised of a PPW with an upper conductive surface and a lower conductive surface, where at least one of the conductive surfaces are fabricated with a MEMS manufacturing process, and where at least one of the conductive surfaces contains release holes, and where the interior of the PPW contains an array of conductive obstacles designed to increase the effective permittivity of the PPW above the permittivity of any host dielectric materials inside the PPW. Host materials within the PPW may include layers of semiconductor or layers of ceramic composites.

A method of manufacturing a slow wave structure (SWS) is disclosed, where an array of conductive obstacles may be formed inside a parallel-plate waveguide using three-dimensional surface micromachining processes involving sequential metal deposition and removal of sacrificial material. Release holes may be formed in an exterior metal surface of the parallel-plate waveguide.

In another example, an absorptive SWS may be comprised of a PPW in which one of the plates is formed by an array of isolated conductive patches and a coplanar resistive film. The patch size, or resistive film value, may be engineered to achieve selected attenuation values. The patch size need not be uniform, but it may vary with position to create an inhomogeneous absorber. The patches need not be square, but may be rectangular, or arrayed with a non-uniform period in orthogonal directions to achieve an anisotropic absorber (non-uniform attenuation in orthogonal directions.)

In yet another example, an absorptive SWS may be comprised of a PPW in which one of the plates is formed by a resistive mesh. The resistive mesh may be embedded in a ceramic substrate. The value of resistance used for the mesh may be selected to achieve a wide range of attenuation values.

A slow wave structure (SWS) to implement an artificial dielectric material is described, where:
 the effective permittivity may be engineered to be between about 10 and about 100;
 the effective permittivity may be varied with position;

the effective permittivity may be anisotropic such that the effective permittivity is a function of the direction of propagation; and, further, a method of fabrication allows characteristic physical features such as the unit cell size to be much smaller than a guide wavelength at the desired operating frequency;

the method of fabrication is compatible with higher levels of system integration required to improve system cost and reliability; and where the loss characteristics may be selected between the limits of an essentially lossless SWS to a high loss SWS by changes to mask layouts or manufacturing process parameters.

BRIEF DESCRIPTION OF THE DRAWINGS

FIG. 8 shows a simulated example of following the design of FIG. 7 along with predicted performance results;

FIG. 17 shows another simulated example following the design of FIGS. 15 and 16 along with computed performance results;

DESCRIPTION

Figure 1:
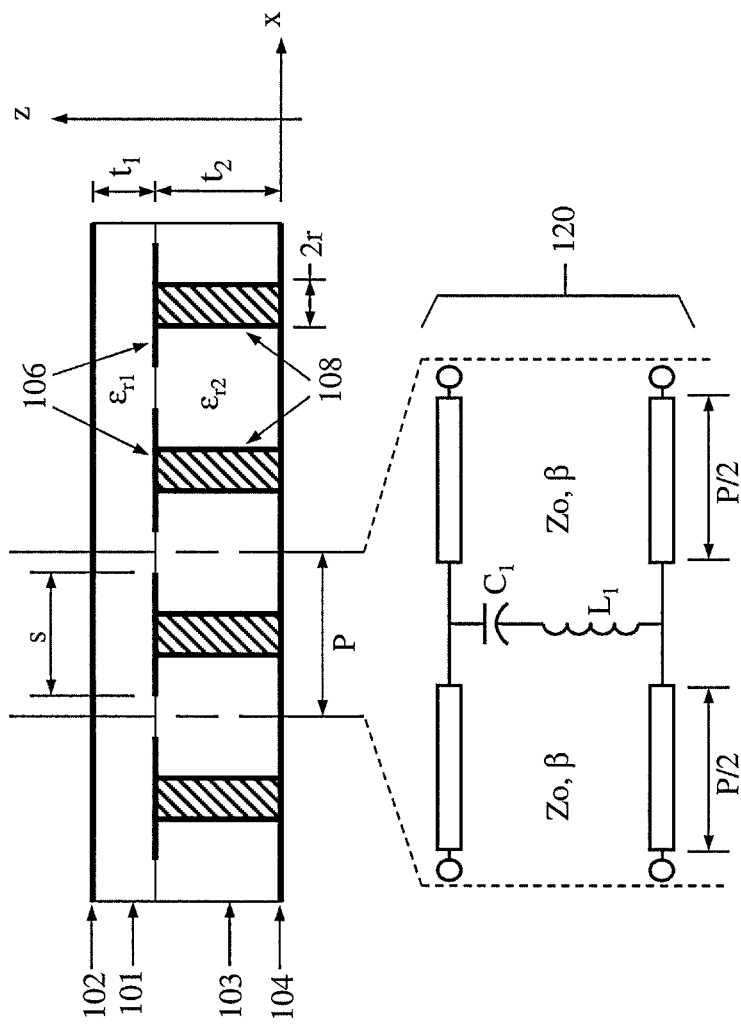
FIG. 1 illustrates an elevation view of a 2D periodic array of resonant vias that forms a slow wave structure (SWS) in a parallel-plate waveguide (PPW)

Reference will now be made in detail to several examples; however, it will be understood by a person of skill in the art that claimed invention is not limited to such examples. Like numbered elements in the same or different drawings perform equivalent functions. In the following description, numerous specific details are set forth in the examples in order to provide a thorough understanding of the subject matter of the claims which, however, may be practiced without some or all of these specific details. In other instances, well known process operations or structures have not been described in detail in order not to unnecessarily obscure the description.

When describing a particular example, the example may include a particular feature, structure, or characteristic, but every example may not necessarily include the particular feature, structure or characteristic. This should not be taken as a suggestion or implication that the features, structure or characteristics of two or more examples should not or could not be combined, except when such a combination is explicitly excluded. When a particular feature, structure, or characteristic is described in connection with an example, a person skilled in the art may give effect to such feature, structure or characteristic in connection with other examples, whether or not explicitly described.

Various examples of slow wave structures (SWS) which may be formed within parallel-plate waveguides (PPWs) are described. The spacing between the parallel plates may be slowly varying on a scale size of a wavelength. Such PPWs with slow wave structures may comprise arrays of conductive obstacles where the size of the obstacles and the spacing between obstacles is less than half of a guide wavelength over the desired frequency range of operation. A slow wave structure (SWS) is a one-dimensional or two-dimensional transmission-line-like structure capable of guiding an electromagnetic wave such that the propagation velocity is less than that of the speed of light in a vacuum. The SWS may be a parallel-plate waveguide having periodic or quasi-periodic discontinuities designed to achieve a desired index of refraction or permittivity at an operating frequency. In an absorptive SWS, a lossy mechanism such as a resistive element may be added to the structure to induce electromagnetic wave attenuation (loss per unit length).

The inhomogeneous PPW may contain anisotropic magneto-dielectric layers in which the permittivity and permeability may be mathematically described as tensors. On more of the layers may be an air gap where $\in=1$. The layers are contained between the upper conductor and the lower conductor such that the internal electromagnetic fields are effectively confined between upper and lower conductors.

Each magneto-dielectric layer may have a unique tensor permittivity $\overline{\overline{\in}}$ and a unique tensor permeability $\overline{\overline{\mu}}$. The tensor permittivity and tensor permeability of each layer may have non-zero elements on the main diagonal, with the x and y tensor directions being in-plane with each respective layer, and the z tensor direction being normal to the layer interface, and the properties of the layer may be described by an effective medium model.

An effective medium model means that individual layers are modeled as homogeneous such that, in the long wavelength limit (as the guide wavelength becomes long with respect to the unit cell dimensions of a periodic structure), the tensor permittivity and permeability of the individual layers accurately model the electromagnetic properties of the physical structure, which may be periodic.

Composite materials that may be described by an effective medium model may be termed magneto-dielectric materials, metalo-dielectric materials, or similar art recognized names. Generally, the composite material is comprised of sub-wavelength inclusions of one or more materials having properties differing from the surrounding (typically dielectric) matrix. Such materials may be formed to have a variety of electromagnetic properties over a wide range of physical scale sizes, where the design scale is measured in wavelengths. Composite materials may exhibit electromagnetic properties which are generally not found in any single material.

If the PPW structure were to be filled with an isotropic homogeneous dielectric material, the dominant electromagnetic propagation mode would be a transverse electromagnetic (TEM) mode that has a uniform z-directed E field and a uniform y-directed H field, assuming propagation in the x direction.

The term "Bloch" waves is used herein to describe voltage waves that travel on periodic transmission-line structures. Conceptually, an infinite periodic transmission line structure of period P in the x direction may support an electromagnetic wave having a voltage V(x) at any point x along a unit cell of the structure such that $V(x)=e^{\pm jk_x x}U(x)$, where U(x) is a periodic function of period P. The total voltage (and current) at a given reference plane of a unit cell vary from one unit cell to the next by a complex constant $e=^{\pm jk_x x}$. A frequency dependent parameter $k_x$ denotes the Bloch wavenumber. The real component of the Bloch wavenumber represents propagating electromagnetic voltages and the imaginary component models evanescent or exponentially decaying electromagnetic voltages.

In the following description, the terms permittivity or effective permittivity $\in_{eff}$ and permeability or effective permeability $\mu_{eff}$ will be understood to refer to relative values thereof as normalized by the free space permittivity $\in_o$ and free space permeability, $\mu_o$, respectively. The index of refraction n is defined to be $n=\sqrt{\mu_{eff}\in_{eff}}$ where $\in_{eff}$ and $\mu_{eff}$ are the effective values of an equivalent modal transmission line for a Bloch mode. A person of skill in the art will readily recognize when the permittivity or permeability is being discussed as being relative (normalized) to the free space permittivity or permeability in MKS units, or when the values of permittivity or permeability in MKS units are appropriate.

It may be helpful to understand the concepts described herein by first considering a circuit model for the SWS along with analytical formulas from which the relative permittivity of the structure may be computed. Shown in FIG. 1 is a planar SWS comprised of a 2D periodic array of internal-T resonant vias. The performance of such a structure as an electromagnetic bandgap (EBG) structure has been described in U.S. Pat. Nos. 7,215,007 and 7,157,992. However, the use of such a structure as an artificial magneto-dielectric material in other frequency regimes (that is, outside of the electromagnetic bandgap regions) is the subject of this application.

Whereas the properties of EBG-like structures where the bandgap properties are used to, for example, suppress various radiated or propagating electromagnetic waves over a frequency band have been previously described, the EBG-like structures described herein may be designed and fabricated so as to have dimensions and material properties such that useful artificial dielectric materials may be fabricated over a wide frequency range of radiated or propagating electromagnetic waves extending from essentially DC, up to, for example, a lower bandgap frequency. Other frequency regimes where propagating wave are supported by the structure may also result in equivalent or analogous artificial dielectric properties.

Conductive surfaces 102 and 104 form the upper and lower plates of the PPW. The plates are spaced apart and are locally parallel to each other. Homogeneous dielectric regions 101 and 103 are defined to have an relative permittivity of $\in_{r1}$ and $\in_{r2}$. Conductive patches 106 are formed at the interface between planar dielectric regions 101 and 103. The patches 106 may be treated as infinitely thin to simplify the analysis. Dielectric regions 101 and 103 each have a thickness of $t_1$ and $t_2$, respectively. Conductive vias or posts 108 are formed in the dielectric region 103 and electrically connect the patches 106 to the lower conductive surface 104. For simplicity of analysis, it is assumed that the 2D periodic structure has a square lattice with period P in the lateral x and y directions, all patches are square in shape with side length s, and all vias are circular in cross section with outer radius r. Conductive vias 108 are connected to the patches 106. A via and its corresponding patch, as shown in FIG. 1, are referred to as an internal-T resonant via, following the terminology of U.S. Pat. No. 7,157,992. A simplified equivalent circuit 120 is shown in FIG. 1 and consists of a finite length P of transmission line of characteristic impedance $Z_o$ and phase constant $\beta$. The shunt LC circuit comprised of $L_1$ and $C_1$ represent an internal-T resonant via.

It may be shown that Bloch mode wave propagation in a PPW filled with a periodic array of resonant vias has the following dispersion equation [equation (9) in U.S. Pat. No. 7,215,007]:

$$\cos(k_x P) = \cos(\beta P) + j\frac{Z_o Y_s}{2}\sin(\beta P) \quad (1)$$

where the phase constant and characteristic impedance of the equivalent transmission line for an empty two dielectric layer PPW are:

$$\beta = \frac{\omega}{c}\sqrt{\varepsilon_{z,\mathit{eff}}} \text{ and} \qquad (2)$$

$$Z_o = \frac{\eta_o}{\sqrt{\varepsilon_{z,\mathit{eff}}}}\frac{t_1+t_2}{P} \qquad (3)$$

where $$\varepsilon_{z,\mathit{eff}} = \frac{t_1+t_2}{\frac{t_1}{\varepsilon_{r1}}+\frac{t_2}{\varepsilon_{r2}}}. \qquad (4)$$

$k_x$ is the Bloch-mode phase constant for the x direction, and $Y_S$ is the shunt admittance of a resonant via. Hence $$k_x = \frac{\omega}{c}\sqrt{\varepsilon_{\mathit{eff}}} \qquad (5)$$

$$Y_s(\omega) = \frac{j\omega C_1}{1-\omega^2 L_1 C_1} \qquad (6)$$

where $C_1$ is estimated to be $$C_1 = \frac{\varepsilon_{r1}\varepsilon_o s^2}{t_1}. \qquad (7)$$

Small argument approximations may be used for the trigonometric functions in the dispersion equation. In the limit, as the frequency goes to zero, the dispersion equation (1) reduces to:

$$1-\frac{1}{2}(k_x P)^2 = 1-\frac{1}{2}(\beta P)^2+j\frac{Z_o}{2}Y_s(\omega)(\beta P) \qquad (8)$$

Substitution of the above variables into this low-frequency form of the dispersion equation allows one to solve explicitly for the Bloch mode effective permittivity $\varepsilon_{\mathit{eff}}$, $$\lim_{\omega\to 0}\varepsilon_{\mathit{eff}} = \varepsilon_{z,\mathit{eff}}+\varepsilon_{r1}\left(\frac{s}{P}\right)^2\left(1+\frac{t_2}{t_1}\right) \qquad (9)$$

where $\varepsilon_{z,\mathit{eff}}$ is the normal component of effective permittivity in the PPW assuming that no conductive obstacles are present, such as patches or vias:

$$\varepsilon_{z,\mathit{eff}} = \frac{t_1+t_2}{\frac{t_1}{\varepsilon_{r1}}+\frac{t_2}{\varepsilon_{r2}}}. \qquad (10)$$

Equation (9) shows that the low-frequency limit of the effective permittivity for the SWS of FIG. 1 can be selected to be arbitrarily large by increasing the ratio of thicknesses $t_2/t_1$. However, in practice, the effective permittivity may be bandwidth limited as discussed below. As is usual, an engineering trade off may be made, depending on the specific design criteria.

Equation (9) shows that $\varepsilon_{\mathit{eff}}$ can be substantially greater than $\varepsilon_{r1}$ because the factor $(1+t_2/t_1)$ can be much greater than unity. Even if dielectric region 103 with permittivity $\varepsilon_{r2}$ is an air dielectric, the effective permittivity $\varepsilon_{\mathit{eff}}$ of the SWS can be much greater than $\varepsilon_{r1}$. Equation (9) suggests, as an example, the use of low-loss, medium-dielectric-constant material for region 101 (such as, for example, high-resistivity Silicon) and the use of a low-loss, low-permittivity medium, such as air, for dielectric region 103. To realize a dielectric medium that is substantially air, the conductive posts 108 and patches 106 as well as the conductive surface 104 can be formed using MEMS processes.

The factor $(s/P)^2$ in equation (9) is less than one, but typically greater than about 0.7. Note that the patch size s can be varied as a function of position to realize a position-dependent effective permittivity: $\varepsilon_{\mathit{eff}}=\varepsilon_{\mathit{eff}}(x,y)$.

Figure 2:
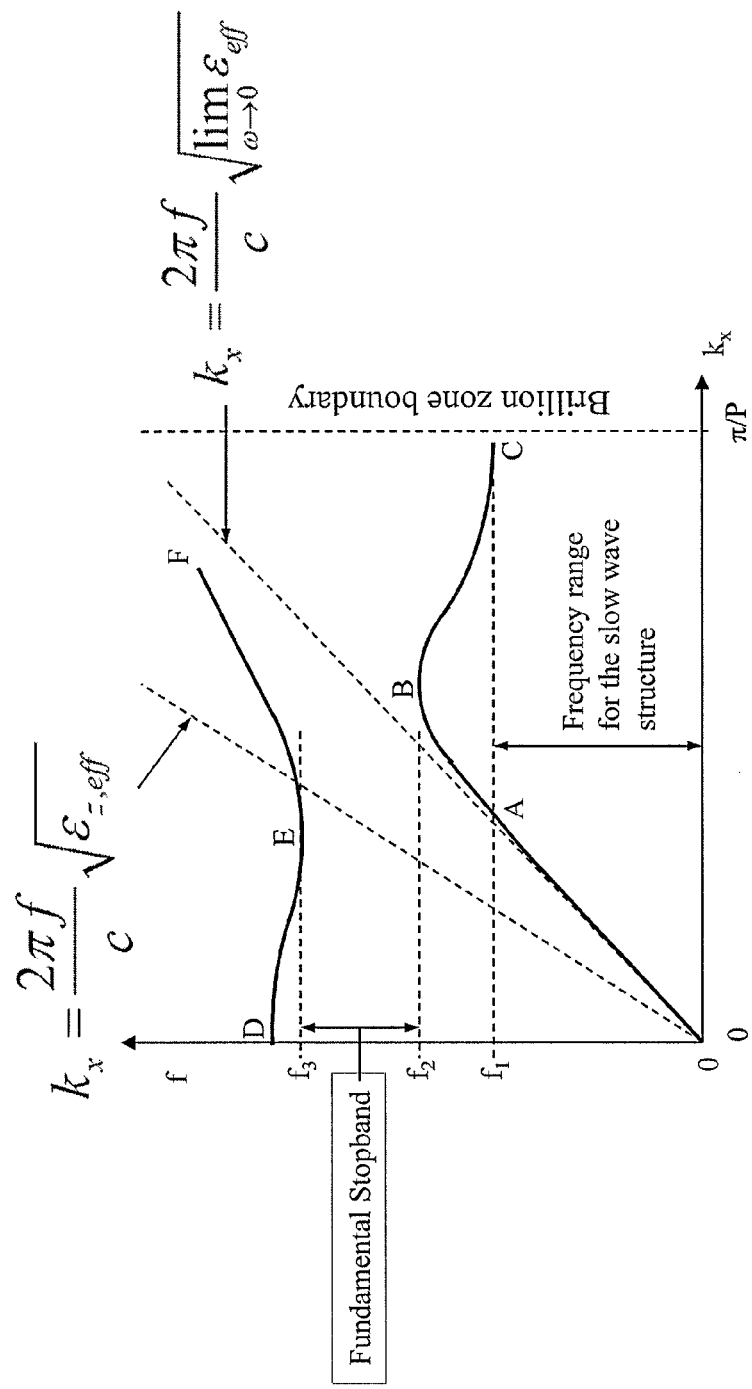
FIG. 2 shows a typical dispersion diagram associated with the SWS of FIG. 1. Formulas for important asymptotes are identified.

Inhomogeneous effective permittivity is also possible, for example, by varying the thicknesses $t_1$ or $t_2$ or both as a function of position, or the spacing between the PPW plates. Where MEMS manufacturing processes are employed to fabricate the conductive posts 108 and the conductive surface 104, the height $t_2$ may be varied such that $t_2=t_2(x,y)$. FIG. 2 is a qualitative representation of a dispersion plot (frequency as a function of wavenumber) for the Bloch modes in a PPW with an isotropic periodic array of internal-T resonant vias. Let us assume a square lattice and consider this dispersion plot to be along the Γ-X contour of the irreducible Brillion zone. Forward waves exist where the slope of the curve is positive, such as from the origin O up to the relative maximum at point B, and from points E (relative minimum) to F. Backward waves exist where the slope of the curve is negative, such as from points B to C and from D to E. The periodicity of the resonant vias creates an electromagnetic bandgap (EBG), or fundamental stopband, between frequencies $f_2$ to $f_3$. Between points B (max) and E (min) there may be another locus (not shown) of the dispersion plot that corresponds to a complex (attenuating) mode formed by a combination of forward and backward waves.

For some microwave component applications, such as a bootlace lens, a single dominant forward wave mode is desired, without backward waves. This limitation may constrain the frequency of operation to the range from DC to $f_1$. Note that the slope of the dispersion curve in this frequency range is asymptotic to the dashed line with a slope of $$c\bigg/\left(2\pi\sqrt{\lim_{\omega\to 0}\varepsilon_{\mathit{eff}}}\right),$$

where c is the speed of light and $\varepsilon_{\mathit{eff}}$ is the effective relative permittivity of the SWS. As frequency of operation increases from DC, the slope of the dispersion curve is reduced and eventually goes to zero at $f_2$. This means that $\varepsilon_{\mathit{eff}}$ increases with frequency and becomes infinite at $f_2$, the lower edge of the fundamental stopband of the EBG. In a practical SWS design, where operation outside of the EBG stopband is intended, it may be desirable to select $f_2$ to be as high as possible, consistent with other design considerations, so as to minimize the dispersion effects in $\varepsilon_{\mathit{eff}}$. This property may be achieved, for example, by one or more of:
  (a) decreasing the period P, or
  (b) decreasing $L_1$, which may be achieved by increasing the via radius r, or (c) decreasing $L_1$ by using a ring of smaller diameter vias as a cluster via for each patch 106 to form a via with a larger effective radius.

Figure 3:
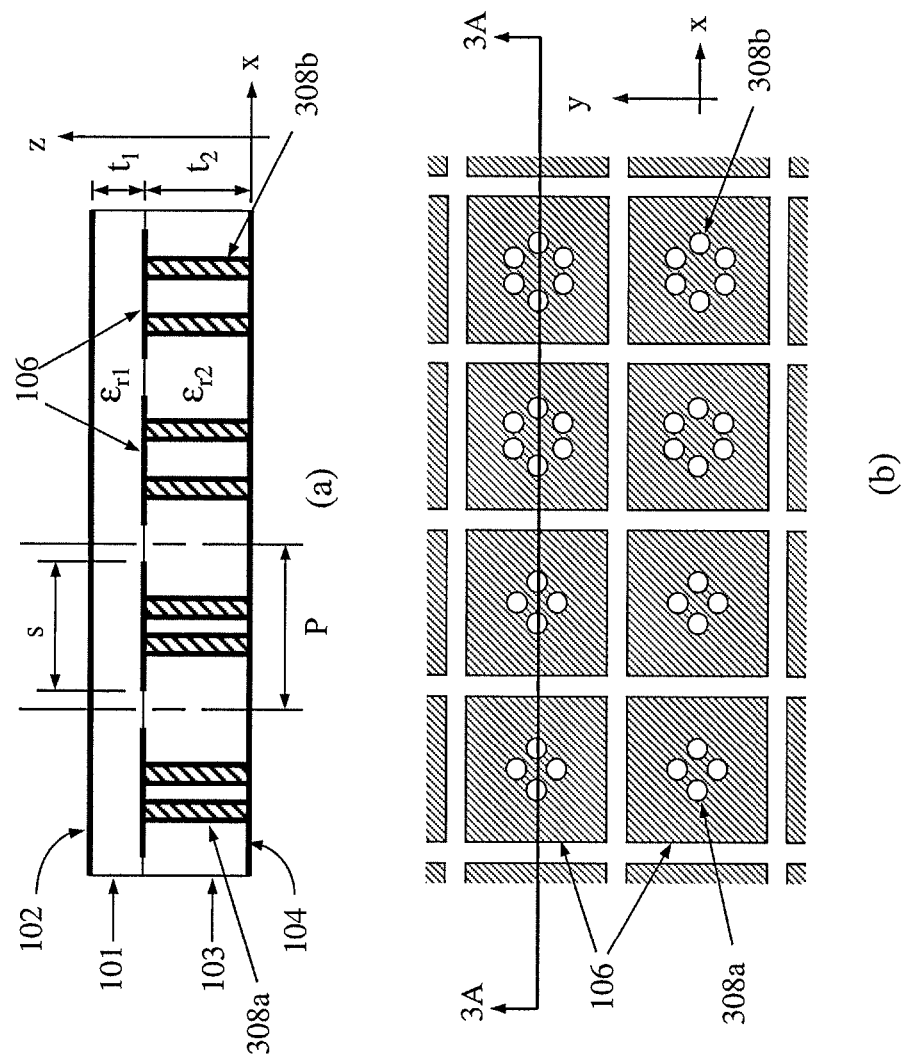
FIG. 3 shows an elevation view and a plan view of a SWS containing an array of resonant vias where each unit cell comprises a ring of vias.

FIG. 3 illustrates \ an internal-T resonant via SWS that employs a ring of vias, 308a or 308b, in each unit cell to result in the equivalent of a via of a larger effective radius. Such a ring of vias may be practical if the SWS is fabricated, for example, as a printed wiring board such as a multilayer printed circuit board or a multilayer ceramic module such as LTCC (low temperature co-fired ceramic). The effective via radius is approximately the radius of the smallest inscribed circle of the ring of vias. The ring of vias may have any number of vias needed to achieve a desired effective radius taking account of the practical size limitations of via diameters used in the printed wiring board technology. In FIG. 3(b), the rings of vias are shown as having either 4 or 6 small vias per unit cell, but any number of vias may be used. The ring of vias is not limited to be circular as a square, hexagonal, or any polygonal layout may be used, as examples. Note that $L_1$ is the inductance of the via 108 or ring of vias (308a, 308b) in a single unit cell in the presence of an infinite array of such vias. The value of $L_1$ may be estimated by formulas listed in column 17 of U.S. Pat. No. 7,215,007.

The use of the term "via" and "a ring of vias" is not intended to constrain the method by which the conductive obstacles are produced. The interior of the vias may be solid, filled with a conductive or non-conductive material, or the like, may have non-regular shapes, or the like, while achieving the aims of the devices described herein.

The EBG lower stopband cutoff frequency $f_2$ may also be increased by reducing the parallel-plate capacitance $C_1$. This may be done, for example, by reducing the area of the patches 106, or by increasing the thickness $t_1$.

Figure 4:
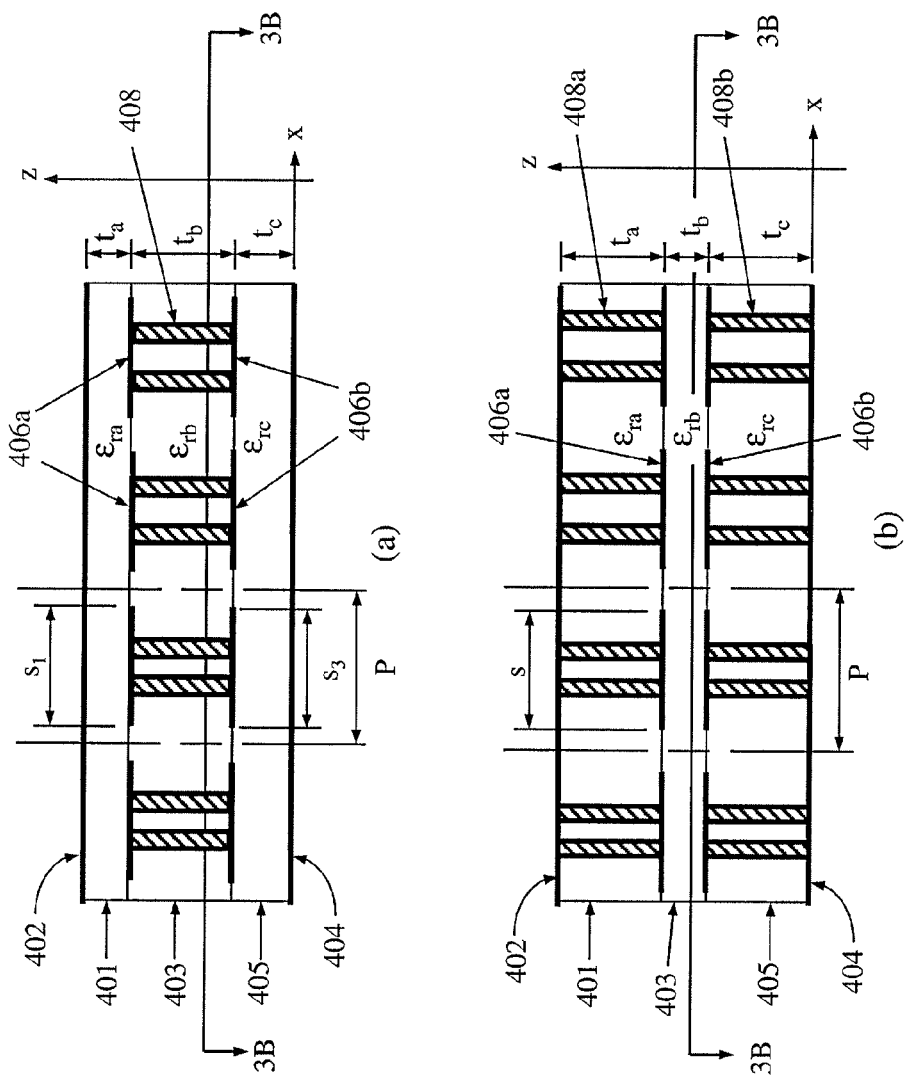
FIG. 4 shows elevation views of a SWS realized by arrays of (a) internal-I resonant vias, and (b) internal double-T resonant vias where each resonant via employs a ring of vias to lower the effective series inductance of its unit cell.

FIG. 4 shows two additional examples of a SWS formed inside a PPW. The PPW is formed by locally parallel conductive plates 402 and 404. Three dielectric regions are identified as layers 401, 403, and 405 having a relative permittivity of $\in_{ra}$, $\in_{rb}$, and $\in_{rc}$ respectively. The examples show arrays of periodic conductive obstacles that may be used to slow down the speed of propagation of the Bloch mode in the PPW. The arrays may be, for example, two-dimensional arrays with a square lattice and period P in x and y directions. Rectangular, triangular, hexagonal, and other periodic arrays or quasi-periodic arrays are also possible, although not illustrated.

In FIG. 4(a) the conductive obstacles are internal-I resonant vias where each conductive obstacle is comprised of an upper conductive patch 406a, a lower conductive patch 406b, and a plurality of conductive vias or posts 408 which electrically connect the upper and lower patches. The plurality of conductive vias comprising a conductive obstacle may form an effective via of larger radius than the radius of any single via or post. This larger effective radius lowers the effective inductance $L_1$ of the internal-I resonant via. The patches 406a and 406b may be, for example, square patches of side length $s_1$ and $s_2$ respectively, although this is not a limitation. The section view associated with cut 3B-3B in FIG. 4(a) is shown in FIG. 3(b) where label 308b is changed to 408, and label 106 is changed to 406b. An analysis similar to that shown above leads to a formula for the low frequency limit of the effective permittivity of FIG. 4(a):

$$\lim_{\omega \to 0} \varepsilon_{\textit{eff}} = \varepsilon_{z,\textit{eff}3} + \frac{t_a + t_b + t_c}{P^2} \frac{1}{\frac{t_a}{\varepsilon_{ra} s_1^2} + \frac{t_c}{\varepsilon_{rc} s_3^2}} \quad (11)$$

where the normal component of effective permittivity for this 3-dielectric-layer PPW without the presence of conductive obstacles is:

$$\varepsilon_{z,\textit{eff}3} = \frac{t_a + t_b + t_c}{\frac{t_a}{\varepsilon_{ra}} + \frac{t_b}{\varepsilon_{rb}} + \frac{t_c}{\varepsilon_{rc}}}. \quad (12)$$

Equation (11) for FIG. 4(a) reduces to equation (9) for FIG. 3(a) for the case when FIG. 4(a) becomes an electrically and mechanically symmetric structure ($\in_{ra}=\in_{rc}=\in_{r1}$, $t_a=t_c=t_1$) and when the length of the vias in FIG. 4(a) is twice the length of the vias in FIG. 3(a), or $t_b=2t_2$. Thus, the effective permittivity of the SWS of FIG. 4(a) can be the same as for FIG. 3(a). However the two SWS structures may have different circuit characteristic impedances. For the present example case, the circuit characteristic impedance of a unit cell in FIG. 4(a) is twice that of FIG. 3(a). This is also true for the characteristic impedance of a PPW where the conductive obstacles are omitted and for the Bloch mode characteristic impedance (where the periodic conductive obstacles are included). The SWS of FIG. 4(a) may be easier to impedance match to a higher impedance feed line than the SWS of FIG. 3(a). Since a SWS may have low characteristic impedances, much less than 50Ω, the SWS of FIG. 4(a) may be preferred over that FIG. 3(a) in some applications.

In FIG. 4(b) the conductive obstacles are internal double-T resonant vias where each conductive obstacle is comprised of an upper conductive patch 406a, a lower conductive patch 406b, a plurality of conductive vias or posts 408a which electrically connect the upper plate 402 to the upper patch 406a, and a plurality of conductive vias or posts 408b which electrically connect the lower plate 404 to the lower patch 406b. The plurality of conductive vias in an internal double-T resonant via may form an effective via of larger radius than the radius of any single via or post. This approach lowers the effective inductance $L_1$ of the internal double-T resonant via. The patches 406a and 406b may be square patches of side length s, but that is not a limitation as any shape of conductive patch is possible, and the patches in a given obstacle may be different sizes. The section view associated with cut 3B-3B in FIG. 4(b) is shown in FIG. 3(b) where the label 308b is changed to 408b, and label 106 is changed to 406b. An analysis similar to that shown previously leads to a formula for the low frequency limit of the effective permittivity of FIG. 4(b):

$$\lim_{\omega \to 0} \varepsilon_{\textit{eff}} = \varepsilon_{z,\textit{eff}3} + \varepsilon_{rb} \frac{s^2}{P^2}\left(1 + \frac{t_a + t_c}{t_b}\right) \quad (13)$$

Equation (13) also reduces to equation (9) for the case of $t_a=t_c=t_2$, $t_b=2t_1$, $\in_{ra}=\in_{rc}=\in_{r2}$, and $\in_{rb}=\in_{r1}$. In this example, the mechanically symmetrical SWS of FIG. 4(b) is twice as tall as the mechanically non-symmetrical SWS of FIG. 3(a), and the Bloch mode characteristic impedance of FIG. 4(b) is twice the value of the Bloch mode characteristic impedance of FIG. 3(a). Therefore, the SWS shown in FIGS. 4(a) and 4(b) can be mechanically and electrically symmetrical in their stackup. Furthermore, when the SWS of FIGS. 4(a) and 4(b) meet the limitations mentioned above, then the electromagnetic field solution for FIG. 3(a) is also the same electromagnetic field solution for the top half or the bottom half of FIGS. 4(a) and 4(b).

The analytical formulas, equations (9), (11), and (13) for $\in_{eff}$, are only approximate because the model ignores, for example, second order effects such as capacitive edge-to-edge coupling between neighboring patches. In general, such parasitic effects will tend to increase the low-frequency effective permittivity above that predicted by equation (9). The analysis also ignores any diamagnetic effect where the vias block transverse magnetic fields resulting in the relative effective permeability being less than unity. However, the above analysis does offer valuable insight into the physical parameters impacting the effective permittivity.

$\in_{eff}$ may also be calculated from the wavenumber $k_x$ using $$\varepsilon_{eff}(f) = \left[\frac{c}{\omega(f)} \mathrm{Re}(k_x(f))\right]^2 \quad (14)$$

where $k_x$ is a numerical solution of the dispersion equation:

$$k_x = \frac{1}{P}\cos^{-1}\left[\cos(\beta d) + j\frac{Z_o Y_s}{2}\sin(\beta d)\right] \quad (15)$$

Equation (15) accounts for frequency dispersion, but does not account for the effects of parasitic capacitance that were ignored in the above analysis. This numerical solution will therefore account for dispersion but not the parasitic effects, which may be computed from a more exact model or estimated. As such, all of the numerical modeling described herein is intended to illustrate the overall expected behavior of the structures and may be used for preliminary design, or where the design parameters are not critical, or may be adjusted by reference to previously constructed devices. Detailed design may either use experimental models or more detailed analytic models so as to take account of fabrication effects, other structure shapes and the like.

The SWS described herein may be fabricated by as number of methods, depending on the operating frequency and corresponding physical size of the components. Millimeterwave components may be produced, for example, using manufacturing processes typically used to make microelectromechanical systems (MEMS). There exist several broad categories of MEMS manufacturing processes, but one manufacturing method is to use surface micromachining. Sequential layers of metal and a sacrificial material are deposited on a substrate. Typical substrates may include ceramic (Alumina and LTCC) and silicon. When all desired material layers are deposited, a sacrificial material layer may be removed leaving air-filled regions. An aspect of the MEMS structures is the release holes may be formed in the metal layers to allow for removal of the sacrificial material. For the SWS discussed below, release holes may be created in the top-most metal layer which may form a part of the PPW. The size of the release holes are selected to be much smaller than $\lambda_o/2$, where $\lambda_o$ is a free-space wavelength at the desired frequency of operation. Each release hole behaves as a hollow metal waveguide whose dominant-mode lower cutoff frequency is well above the desired SWS operating frequency, and, therefore, leakage of energy through the aperture formed by the release hole is suppressed.

An example of a commercial micromachining processes is the POLYSTRATA Cu process available from Nuvotronics LLC in Radford, Va. This MEMS process is a sequential deposition process where Cu metal layers can be formed on a substrate, and where each Cu layer may be typically 10 um to 100 um in thickness. The sacrificial material is a proprietary photoresist. A non-sacrificial dielectric polymer may also be included in the deposition process to remain as an insulating support. This polymer dielectric has been used to fabricate TEM mode waveguides. See U.S. Pat. No. 7,012,489, which is incorporated herein by reference, for more details.

Another surface micromachining technology is the MICA FREEFORM process available from Microfabrica in Van Nuys, Calif. This process uses a variety of different metals including a NiCo alloy, Rhodium, and Palladium. In the FREEFORM process, Cu is used as the sacrificial material. This MEMS manufacturing process can accommodate up to 50 metal layers, where each layer can be designed to be between 5 um and 25 um in height.

Figure 5:
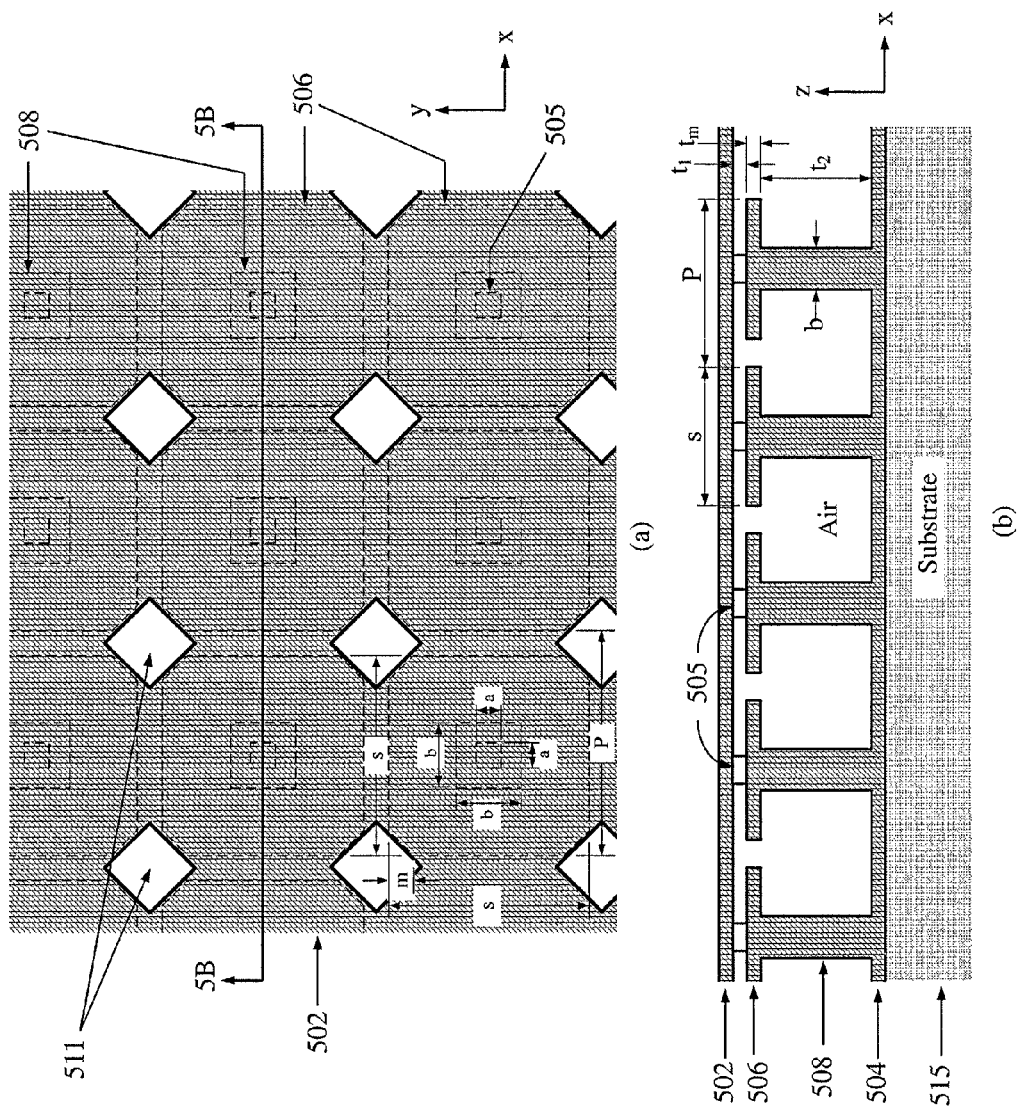
FIG. 5 shows an example in (a) a plan view, and (b) an elevation view.

An example of a MEMS SWS is shown in FIG. 5. A plan view of this periodic two-dimensional metal and dielectric structure is shown in FIG. 5(a). An elevation view is shown in FIG. 5(b) which is also section cut 5B-5B from FIG. 5(a). The MEMS SWS may, for example, be fabricated on a substrate 515 of silicon, ceramic, sapphire, or other suitable material. The hatched portions of the drawings designate a conductive material, typically metal. For instance, this metal may be Cu in the POLYSTRATA Process. The upper and lower conductive plates that form the PPW are 502 and 504. The conductive patches 506 are conductive slabs of thickness $t_m$. The patches 506 have a square footprint of side length s, less a miter dimension m at each corner. The upper surface of the patches 506 are formed a distance $t_1$ from the inside surface of the upper plate 502 of the PPW. The conductive posts 508 may be formed as square posts of height $t_2$ and width b. These posts may provide physical support for the patches 506, and electrically connect the patches to the inside surface of the lower plate 504 of the PPW. Insulating dielectric posts 505 may provide physical support of the conductive plate 502 while preventing a DC connection between the upper and lower plates 502 and 504 of the PPW. The dielectric posts 505 may be, for example, a polymer material such as is used in the POLYSTRATA process. The dielectric posts 505 may be smaller in area than the patches (a<<s) so as to minimize the RF loss associated with their dielectric material.

FIG. 5(a) shows the array of release holes 511 that is formed in the uppermost metal layer that forms the top conductive plate of the PPW. These release holes allow for removal of the sacrificial material that surrounds the conductive posts 508, patches 506 and dielectric posts 505 during the MEMS fabrication process. The region originally occupied by the sacrificial material becomes an air region once the sacrificial material is removed.

Figure 6:
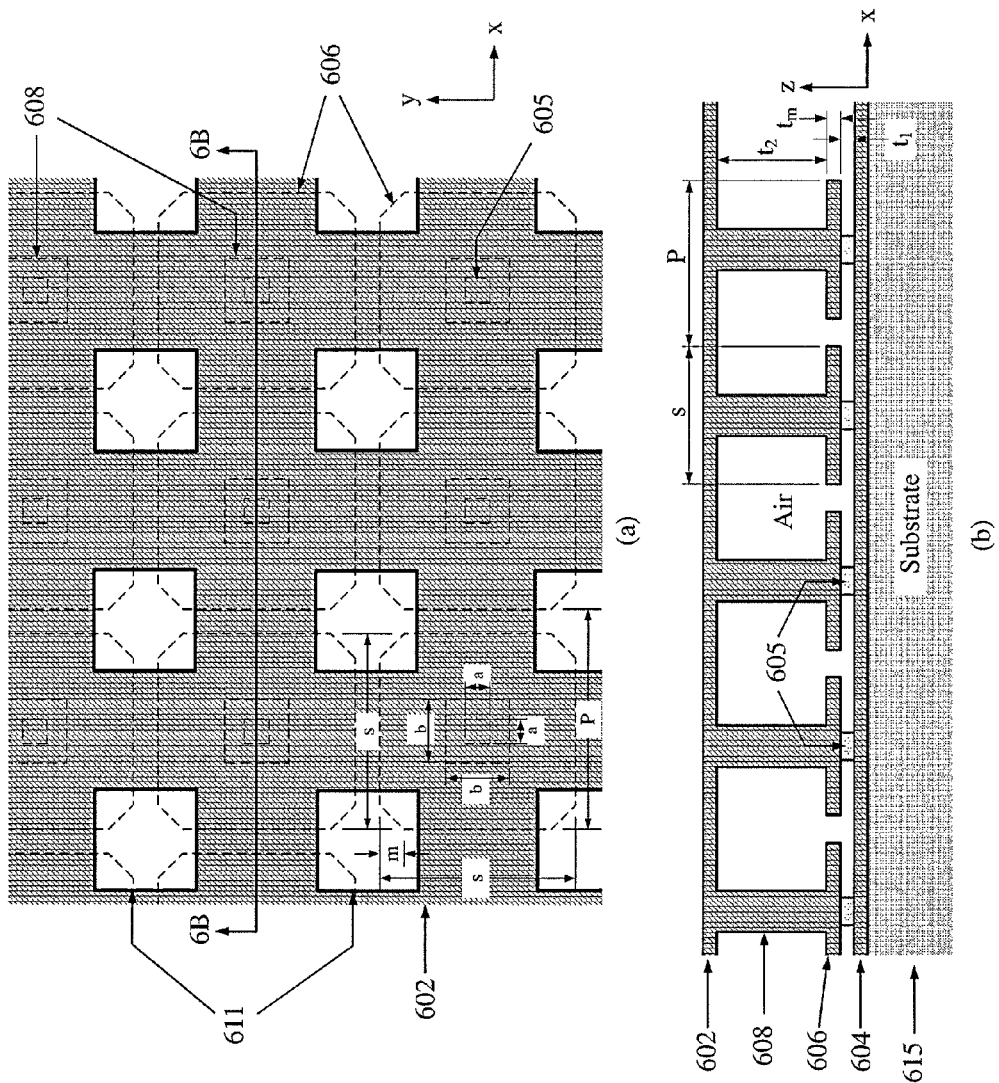
FIG. 6 shows another example in (a) a plan view, and (b) an elevation view.

FIG. 6 shows another example of a MEMS SWS where the conductive patches 606 are located closer to the lower conductive plate 604 of the PPW than to the upper conductive plate 602 and, hence, closer to the substrate 615. The separation distance between the patches 606 and the nearest inside surface of the PPW is $t_1$. Across this gap insulating dielectric posts 605 are disposed, which may provide mechanical support for the conductive patches 606, the conductive posts 608, and the upper metal plate of the PPW, FIG. 6 also has an array of release holes 611 located in the upper metal surface 602 of the MEMS structure. The release holes 611 can be made larger in the SWS of FIG. 6 relative to the SWS of FIG. 5 because the release holes 611 are not located in the same surface used to form a parallel plate capacitance with the patches 506 or 606.

Figure 7:
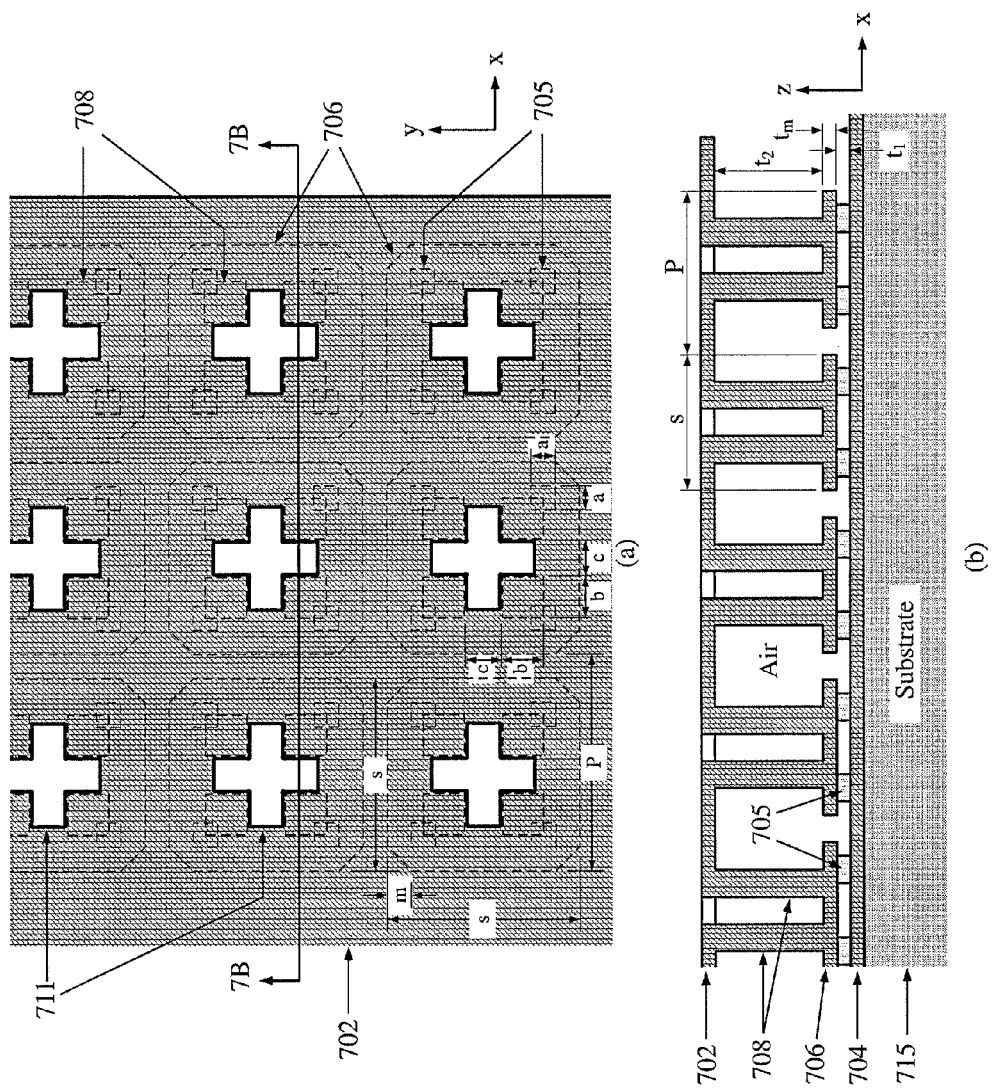
FIG. 7 shows another example in (a) a plan view, and (b) an elevation view.

FIG. 7 shows yet another example of a MEMS SWS. FIG. 7(a) is a plan view and FIG. 7(b) is an elevation view showing section cut 7B-7B. This SWS differs from the example shown in FIG. 6 in several ways. First, the conductive patches 706 are connected to the upper plate of the PPW by using a cluster of four conductive posts instead of a single post as shown in FIG. 6. Second, the release holes 711 in the upper plate of the PPW are positioned in between the conductive posts 708, or inside the cluster of posts, associated with a patch 706. The release holes 711 may be, for example, cross-shaped holes. The location selected for the release holes in this example causes the holes to experience low tangential magnetic fields associated with the propagating Bloch mode. Therefore, the internal electromagnetic fields may be less likely to leak from release holes designed in this manner when compared with the release holes shown in FIGS. 5 and 6.

Another aspect of the example shown in FIG. 7 is the fact that four insulating dielectric posts 705 are may be used as mechanical support for each conductive patch 706 and the associated cluster of four conductive posts 708.

FIG. 8(a) shows an example of a MEMS SWS where the design parameters are as shown in FIG. 7. In this isotropic example, the period is 500 um in both x and y directions, the patches are 400 um square with no miter, and the conductive posts are 80 um square. The release holes are cross-shaped with a width of 80 um and an overall length of 240 um in both x and y directions. The dielectric support posts are 80 um square and with a relative permittivity of 2.65. The conductive patches and the upper and lower conductive plates forming the PPW are all 50 um in thickness.

The computed electrical performance of this example SWS is shown in FIGS. 8(b), 8(c), and 8(d). FIG. 8(b) shows the period divided by the guide wavelength for the Bloch mode in the PPW. It may be desirable to have many periods per guide wavelength so that the effective permittivity is isotropic: that is, essentially the same in all lateral directions. If, for example, there are 6 periods per guide wavelength, then this constraint will be satisfied up to approximately 42 GHz in this example. FIG. 8(c) shows the effective relative permittivity of about 6.5 as a low frequency limit, and rising monotonically to become unbounded near 80 GHz where the lower edge of the fundamental EBG stopband is encountered. The index of refraction is also shown in FIG. 8(d). Note that this MEMS structure is essentially an air-filled PPW. Thus, the effective relative permittivity of the PPW can exceed 6 due entirely to the periodic array of conductive obstacles formed by the conductive patches 706 and conductive posts 708. The plot of refractive index shows that the Bloch mode travels at a maximum speed which is less than ½ of the speed of light in a vacuum.

The results shown in FIGS. 8(b), 8(c), and 8(d) are numerical results obtained from a full-wave simulation. A finite length of SWS was modeled in a TEM mode waveguide (WG). The WG needs to be only one-half of a unit cell in width, but a full unit cell is displayed in FIG. 8(a) for clarity. The sides of the WG are defined to be magnetic walls to have the appropriate boundary conditions for wave propagation an infinite 2D array. Each end of the WG model has a finite-length air-filled section where no conductive obstacles (no unit cells) are located. The WG may be simulated using MICROSTRIPES, a commercial transmission line matrix (TLM) electromagnetic simulation code available from CST in Framingham, Mass. Two port s parameters are computed. Of course, any simulation tool that provides accurate s parameters may be used.

The s parameters are post-processed using the following equations to obtain the effective permittivity:

$$\varepsilon_{\textit{eff}} = \frac{\mu_{\textit{eff}}}{\left[x - \sqrt{x^2 - 1}\right]^2} \quad (16)$$

where (17)

$$x = 10^{\left[\frac{-min(S_{21} \text{ in } dB)}{20}\right]}$$

and $\mu_{\textit{eff}}$ is the effective relative permeability of the SWS. Note that x is a function of frequency, as it is calculated at the nulls of $S_{21}$ (dB units). This yields values of effective relative permittivity that are frequency dependent, as expected. The simulated WG model should have a sufficient number of unit cells to allow $\varepsilon_{\textit{eff}}$ to be calculated over the desired frequency range of interest. For most MEMS SWS designs, 10 to 20 unit cells are usually sufficient. The index of refraction n may be calculated from $n=\sqrt{\mu_{\textit{eff}}\varepsilon_{\textit{eff}}}$.

The effective relative permeability $\mu_{\textit{eff}}$ of the low-loss SWS shown above can be approximated as a constant for frequencies below the fundamental EBG stopband. The effective permeability is diamagnetic in this frequency regime, having a value less than unity because the conductive obstacles block a portion of the transverse magnetic field associated with the Bloch mode. For the example shown in FIG. 8, $\mu_{\textit{eff}}=0.662$. Both $\varepsilon_{\textit{eff}}$ and $\mu_{\textit{eff}}$ can be accurately calculated in their low frequency limit using algorithms published by A. M. Nicolson and G. F. Ross, "Measurement of the Intrinsic Properties of Materials by Time-Domain Techniques," *IEEE Trans. on Instrumentation and Measurement*, Vol. IM-19, No. 4, November 1970.

Figure 9:
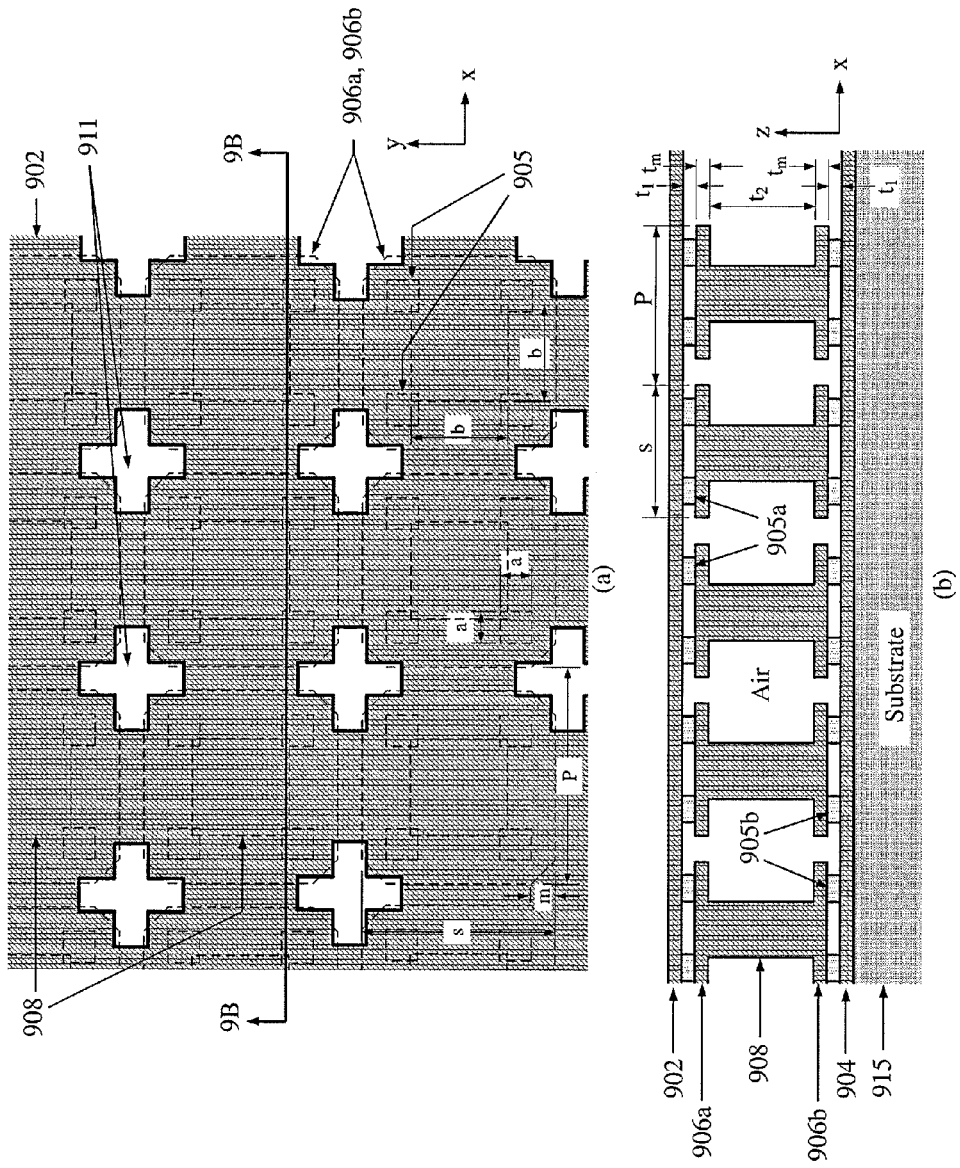
FIG. 9 shows another example in (a) a plan view, and (b) an elevation view.

FIG. 9 shows another example of a MEMS SWS where the conductive obstacles are internal-I resonant vias. A plan view of this periodic two-dimensional metal and dielectric structure is shown in FIG. 9(a). This SWS is isotropic with period and patch dimensions that are the same in both the x and y directions. An elevation view is shown in FIG. 9(b) which is a section cut 9B-9B from FIG. 9(a). Conductive plates 902 and 904 form a PPW. The conductive obstacles are comprised of upper patches 906a, lower patches 906b, and posts 908 that are used to electrically interconnect the patches and to provide mechanical support. The conductive patches 906a and 906b may be square in shape with mitered corners. Both upper and lower patches shown in FIG. 9 have the same size, but this is not a limitation as they may have different sizes and still realize a shunt LC circuit between upper and lower conductive plates 902 and 904. The lower patches are formed a distance $t_1$ above the inside surface of the lower conductive plate 904, and they are supported by insulating dielectric posts 905b. In this example, four posts 905b are illustrated per unit cell to mechanically support each lower patch 906b. However, any number and any placement of posts may be used. The position or layout of dielectric posts may differ from upper to lower patches within a unit cell, or even between different conductive obstacles. Similarly, insulating dielectric posts 905a are formed between patches 906a and the inside surface of the upper conductive plate 902 of the PPW. The height of both upper and lower dielectric posts 905a and 905b are shown to be $t_1$, but this is not a limitation as the upper and lower dielectric posts may have different heights. The SWS shown in FIG. 9 may have a Bloch mode impedance that is approximately twice as large as the Bloch mode impedance of SWS shown in FIG. 5 or 6, while exhibiting similar effective relative permittivity $\varepsilon_{\textit{eff}}$ and index of refraction.

FIG. 9(a) shows release holes 911 shaped as crosses. The release holes are centered at the corners of the unit cells, above the gaps between conductive patches 906a. Any shape of release hole may be used, but the cross shape is selected for FIG. 9 to have a small effect on the parallel-plate capacitance between the upper conductive patches 906a and the upper conductive plate 902.

The MEM SWS of FIGS. 5, 6, 7, and 9 may be supported by a substrate which may be Silicon, ceramic, sapphire, $Al_2O_3$, or any other suitable material upon which MEMS structures may be built. The SWS may be released from the substrate without changing its electrical performance. The released SWS may be used in a higher level assembly or package or SiP (system in package) such as a transmitter, a receiver, a radar system, or an integrated antenna system, where a component having a specific effective permittivity is needed.

High-resistivity Silicon may be a suitable material to employ as the basis for a capacitive layer (dielectric 101 in FIG. 1) of a SWS because it exhibits low loss at millimeterwave frequencies. The loss tangent in Silicon due to bulk resistivity ρ is:

$$\tan\delta = \frac{1}{\omega\varepsilon_o\varepsilon_r\rho} \quad (18)$$

where $\in_{eff}$=11.7. Silicon of ρ=1000 Ω-cm resistivity has a loss tangent of 0.00207 at 77 GHz.

Figure 10:
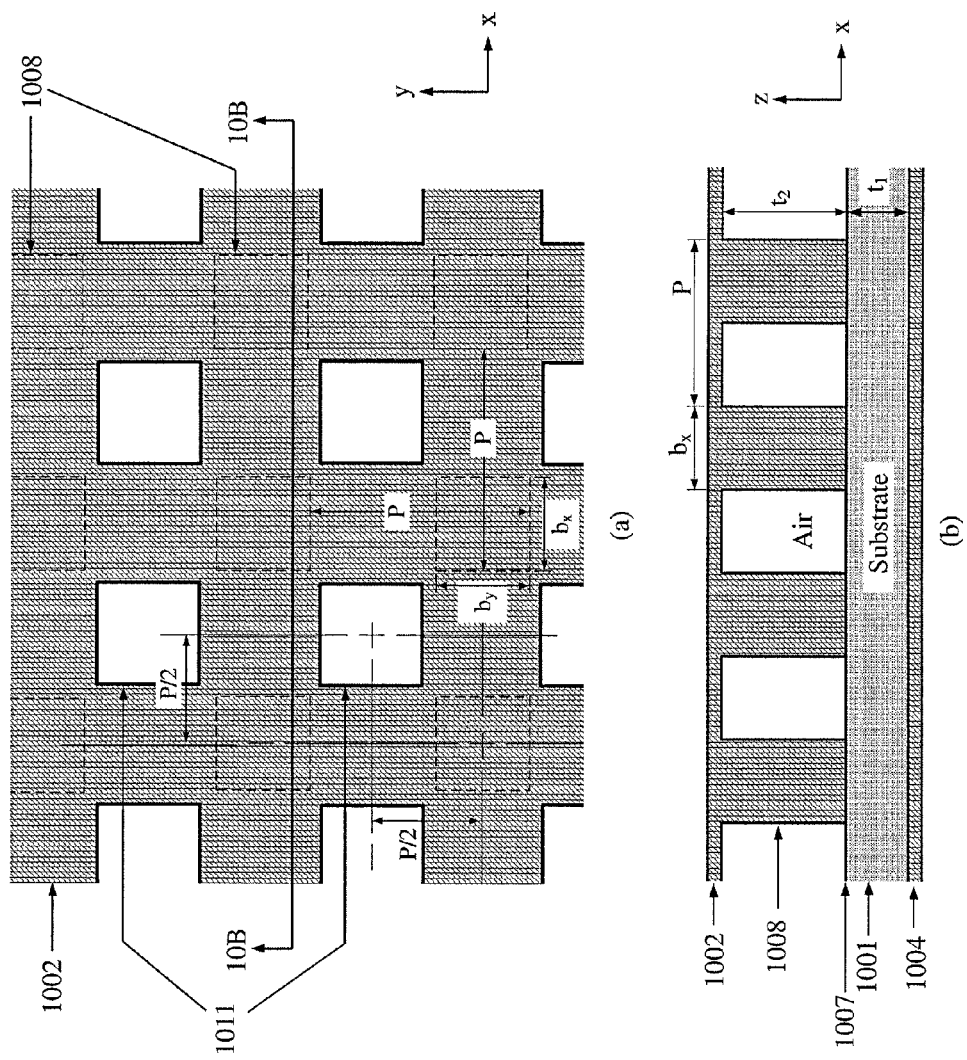
FIG. 10 shows another example of the present invention in (a) a plan view, and (b) an elevation view.

FIG. 10 shows an alternative example of a MEMS SWS where the substrate upon which the MEMS structure is built is part of the SWS. That is, the RF power in the E and H fields of the Bloch mode travels in the substrate region as well as the air region. In this configuration, a very high effective permittivity can be realized inside the PPW, which results in a significant size reduction for microwave and millimeterwave components that incorporate a PPW.

FIG. 10(a) shows a plan view of a SWS where rectangular conductive posts 1008 of cross sectional dimensions $b_x$ by $b_y$ are formed on the surface of the substrate 1001. The elevation view in FIG. 10(b) is a section view along cut 10B-10B. The bottom of the substrate 1001 has a conductive layer 1004 forming the bottom of the PPW. This conductive layer may be typically about 0.5 um to about 3 um of a substantially solid metal such as gold or copper to act as the lower plate of the PPW. The conductive plate 1002 may form the upper plate of the PPW.

The conductive posts 1008 have a height $t_2$ and are formed on a substrate whose thickness is $t_1$. The interface 1007 at the top surface of the substrate may be a polished surface to reduce RF losses or to provide a smooth surface for deposition of the metal layers forming the MEMS structure. The region surrounding the conductive posts 1008 may be an air-filled region, after a sacrificial material has been removed. Release holes 1011 may be formed in the upper plate 1002 of the PPW. FIG. 10(a) shows an array of rectangular release holes 1011 offset by half of a period in the x and y directions from the centerlines of the conductive posts 1008. This symmetry allows the effective permittivity to be isotropic in the low frequency limit if $b_x=b_y$.

Figure 11:
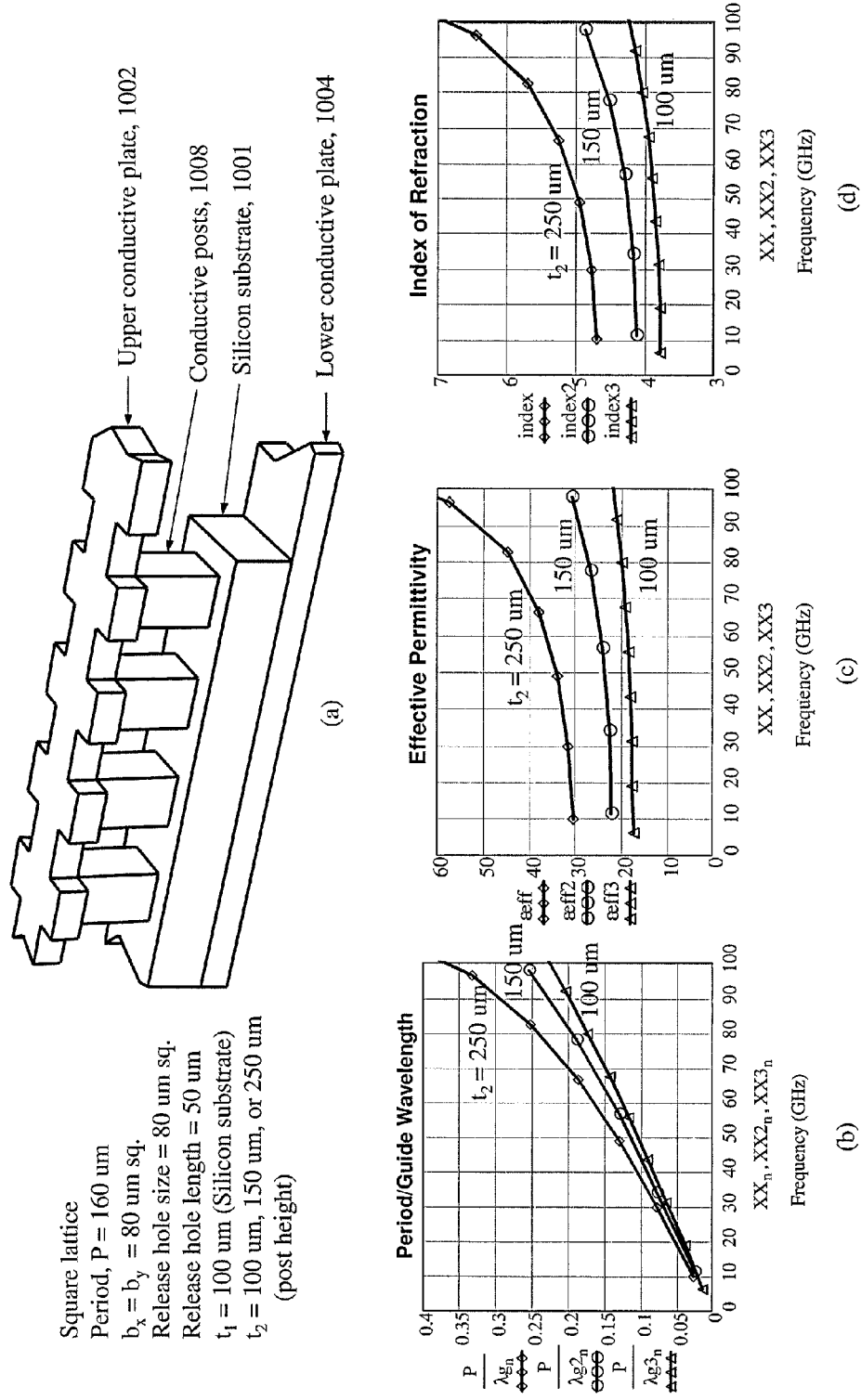
FIG. 11 shows another example of the invention following the design of FIG. 10 along with computed performance results.

FIG. 11 shows an example of a MEMS SWS where the design features are illustrated in FIG. 10. In this isotropic example, the period P is 160 um, the conductive posts are 80 um sq., the release holes are 80 um sq., and the thickness $t_1$ of the lossless silicon substrate is 100 um. The computed electrical performance of this example SWS is shown in FIGS. 11(b), 11(c), and 11(d) as a function of the post height $t_2$. FIG. 9(b) shows the period P divided by the guide wavelength for the Bloch mode in the PPW. FIG. 11(c) shows the effective relative permittivity whose value at the low-frequency limit varies from about 18 up to about 30 as the post height increases from 100 um to 250 um. Note that the highest permittivity individual material in the SWS is the Silicon where $\in_r$ is 11.7. The dispersion effect becomes more pronounced as the post height $t_2$ increases, and the bandwidth decreases as the initial (low frequency) effective permittivity increases. The corresponding index of refraction is shown in FIG. 11(d). In this example, the distance between the upper and lower conductive plates (interior height of the PPW) varies from 200 um to 350 um.

Figure 12:
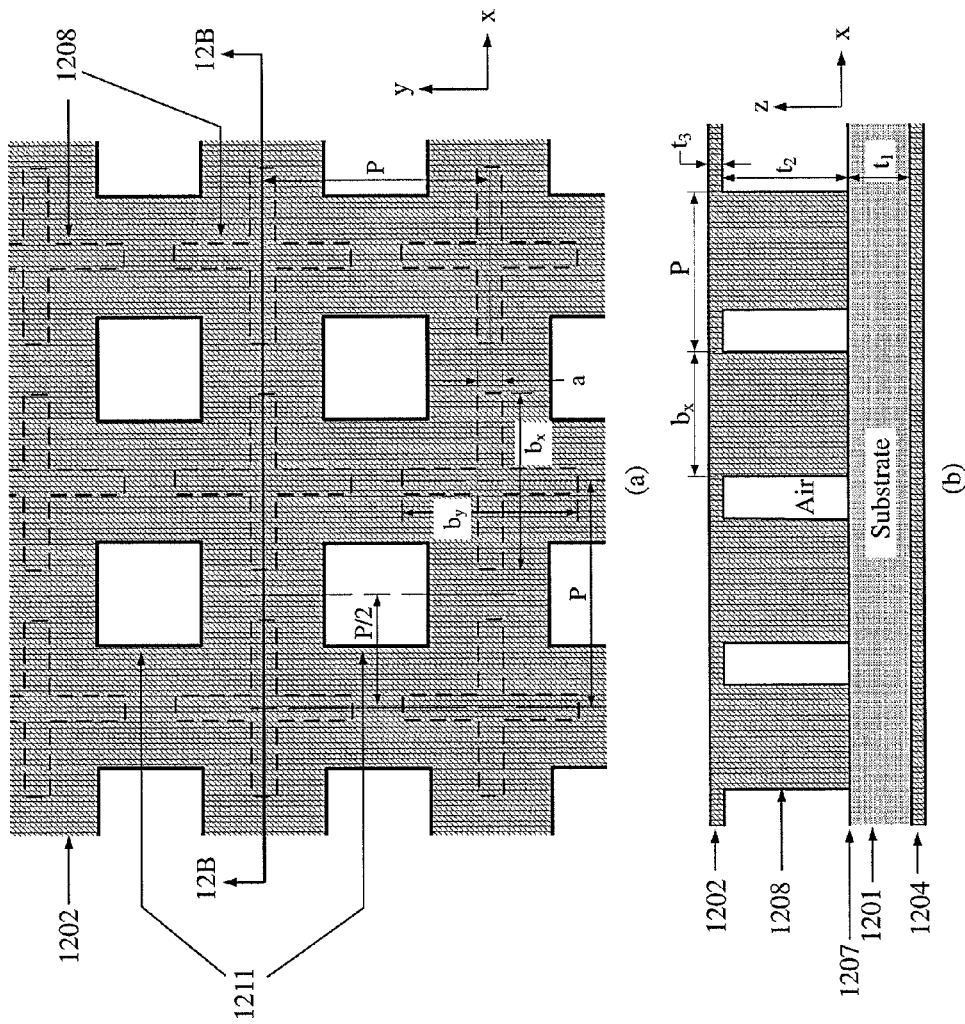
FIG. 12 shows another example in (a) a plan view, and (b) an elevation view.

FIG. 12 shows another example of an SWS built on a substrate similar to the example of FIG. 10. The difference is the shape of the conductive posts. In the plan view of FIG. 12(a), the conductive posts 1208 are formed in the shape of a cross. The overall dimensions of the cross are $b_x$ and $b_y$ in the x and y directions respectively. The thickness or width of each arm of the cross is dimension a. The elevation view in FIG. 12(b) is a section view along cut 12B-12B. The bottom of the substrate 1201 has a conductive layer 1204. In practice, this conductive layer may be about 1 um to about 3 um of a substantially solid metal such as gold, to act as the lower plate of the PPW. The upper conductive layer 1202 forms the upper plate of the PPW.

Figure 14:
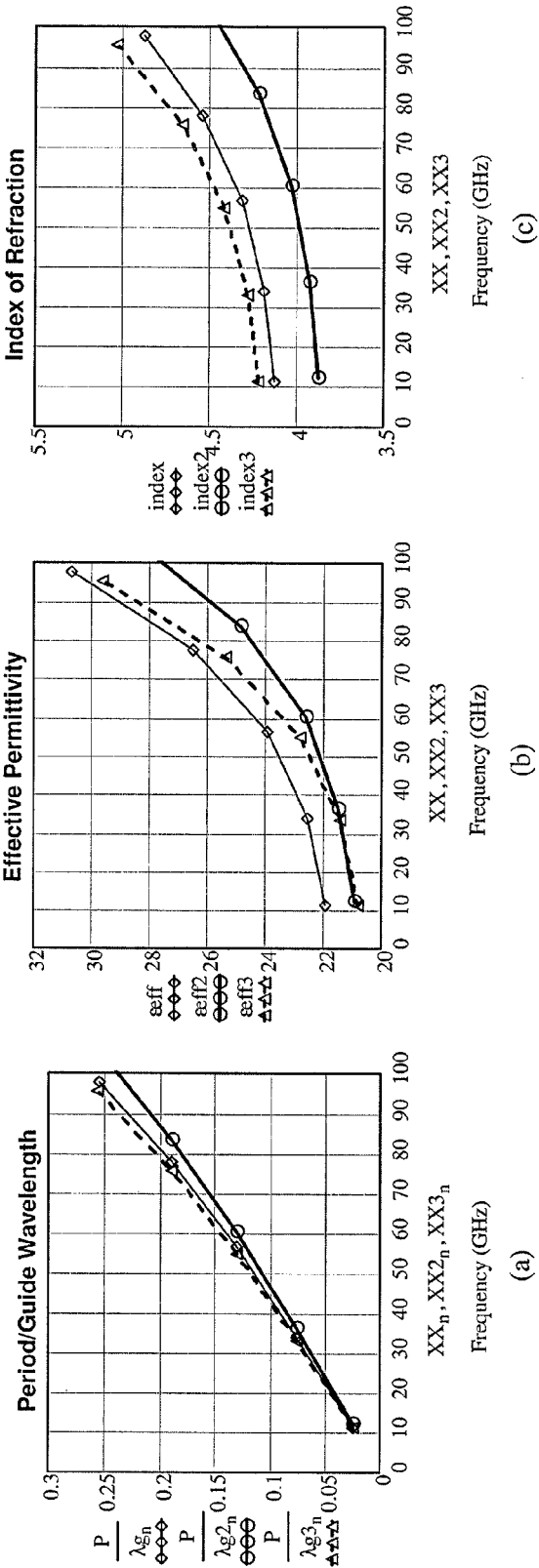
FIG. 14 shows another example following the design of FIG. 10 along with computed performance results for an anisotropic SWS.

The conductive posts 1208 have a height $t_2$ and they are formed on the substrate 1201 of thickness $t_1$. The interface 1207 at the top surface of the substrate may be a polished surface. The region surrounding the conductive posts 1208 may be an air-filled region. Release holes 1211 may be formed in the upper plate 1202 of the PPW. FIG. 12(a) shows an array of rectangular release holes 1211 offset by half of a period in the x and y directions from the centerlines of the conductive posts 1208. This symmetry allows the effective permittivity to be isotropic in the low frequency limit if $b_x=b_y$. If $b_x\neq b_y$, then the effective permittivity will be anisotropic, assuming an equal period for the conductive posts in the x and y directions. FIG. 14 shows results for two anisotropic cases.

Figure 13:
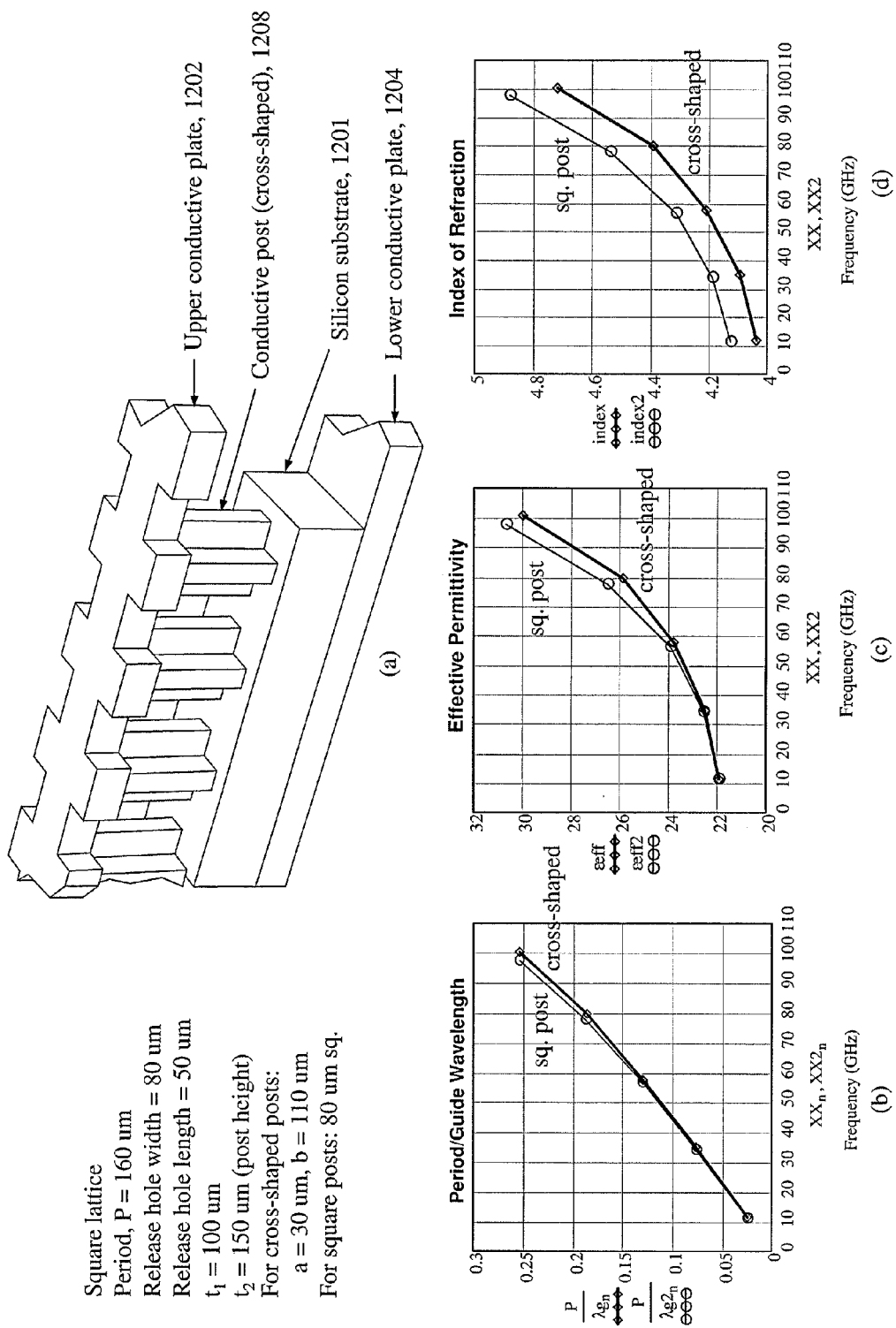
FIG. 13 shows another example following the design of FIG. 12 along with computed performance results.

FIG. 13(a) shows a 3D view of an example of a SWS whose design aspects are illustrated in FIG. 12. For this isotropic SWS, the period is 160 um, the release holes are 80 um sq., the thickness $t_1$ of the lossless Silicon substrate is 100 um, and the height of the conductive posts $t_2$ is 150 um. The computed electrical performance results are shown in FIGS. 13(b), 13(c), and 13(d) where the cross-shaped post is compared to a square post where both designs have nearly the same low-frequency effective permittivity. The only difference between the two SWS designs is the shape of the posts. For the cross-shaped post, $b_x=b_y=b=110$ um, and a=30 um. For the case of square posts, the size is 80 um sq. The comparison of effective permittivity in FIG. 13(c) shows that the cross-shaped conductive post has less frequency dispersion than the square post, which makes the cross-shaped design a more broadband SWS. Assuming the same low frequency effective permittivity, the cross-shaped post will have a lower value of effective shunt inductance $L_1$ which in turn raises the cutoff frequency $f_2$ for the fundamental EBG stopband. The corresponding comparison for index of refraction is shown in FIG. 13(d).

A person of skill in the art will recognize that the conductive structures connecting to patches may be termed vias, posts, or the like without implying a specific limitation on cross sectional shape on internal construction. The desired electromagnetic properties may be equivalently achieved by various structural shapes, and the use of common examples is not intended to be limiting herein.

The effective permittivity of the SWS described in FIG. 10 will be anisotropic (wave direction dependent) if $b_x \neq b_y$. FIG. 14 shows computed performance results for the SWS geometry of FIG. 10 for three different examples where the only physical difference between the structures is the cross sectional shape of the conductive posts. In all three cases the direction of wave propagation is the x direction.

Consider FIG. 14(b) for $\epsilon_{eff}$. The lighter-weight solid line is for the isotropic case where $b_x = b_y = 80$ um. The heavy solid line is for one anisotropic case where the post is rectangular with the long axis of the rectangle in the x direction: $b_x = 110$ um, $b_y = 50$ um. The dashed line is for another anisotropic case where the post is also rectangular, but the long axis of the rectangle runs in the y direction: $b_x = 50$ um, $b_y = 110$ um. FIG. 14(b) shows that the low-frequency limit for permittivity is dependent on the shape of the conductive post with respect to the direction of wave propagation. The SWS with rectangular posts, where the posts have a long axis perpendicular (parallel) to the direction of wave propagation, exhibit the higher (lower) effective permittivity. FIG. 14(a) shows the period per guide wavelength for the three cases, and FIG. 14(c) shows the corresponding index of refraction. The highest index of refraction is for the anisotropic case where the posts have a long axis perpendicular to the direction of wave propagation. Note that the effective relative permeability $\mu_{eff}$ differs for all three cases.

A SWS may be fabricated on a multilayer ceramic substrate 1530 as shown in FIG. 15(b), where ceramic layers include 1501a, 1501b, and 1501c. MEMS manufacturing processes may be used to fabricate the upper plate 1502 of the PPW, the posts 1508, and the patches 1506. The manufacturing process may build a SWS on a ceramic substrate which has already been constructed to have a buried low-loss RF ground plane to form the lower parallel plate of the PPW. Ideally, this buried ground plane would be a solid perfectly conductive sheet. However, buried metal layers in a multilayer ceramic substrate such as LTCC (low temperature co-fired ceramic) are usually fabricated as a meshed structure for adhesion purposes, and one example may have the RF ground plane realized using 2 metal layers of mesh 1504a and 1504b (typically made of Ag or Au) that are connected with a 2D array of periodic vias 1510 (typically made of Ag or Au). The meshed metal layers 1504a and 1504b may be, for example, uniform traces running in both the x and y orthogonal directions on each layer where the meshed traces electrically contact the ends of the buried vias 1510.

FIG. 15(a) shows release holes 1511 in the upper conductive plate 1502 that are formed in the shape of a cross and located in between clusters of conductive posts 1508. The array of patches 1506 are shown as hidden lines, as are the buried vias 1510 inside the ceramic substrate. The meshed ground plane formed by metal layers 1504a and 1504b is omitted in FIG. 15(a) to show other features more clearly.

Figure 16:
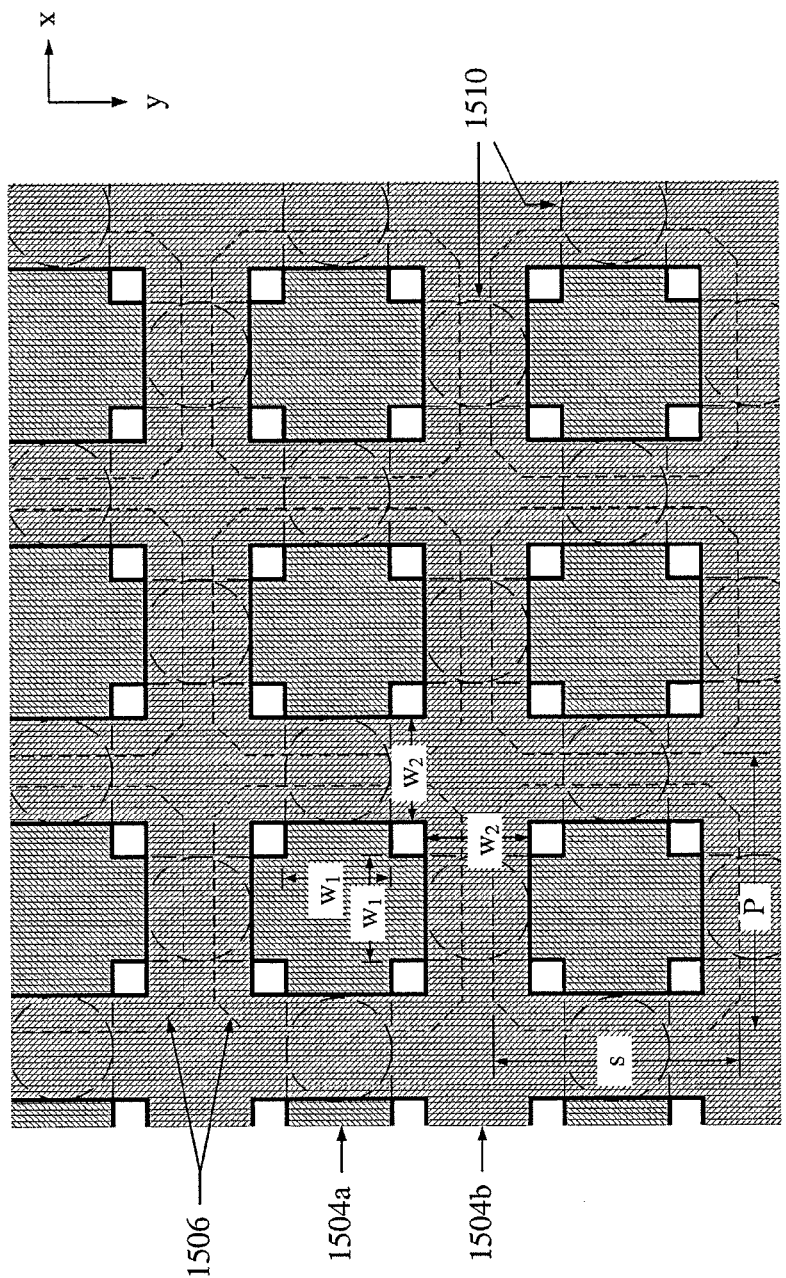
FIG. 16 shows a plan view of the example of FIG. 15 where features of a two-layer meshed ground plane are detailed.

A plan view of this example is shown in FIG. 16 where the following features are visible: meshed layers 1504a, 1504b, the blind vias 1510, and the patches 1506. Other features such as the release holes and the conductive posts are hidden for clarity. FIG. 16 is a plan view from below the meshed ground plane (seen from inside the ceramic substrate). In FIG. 16 the upper mesh 1504a has a period P in the orthogonal x and y directions, and the trace width is $w_1$. The lower mesh 1504b also has a period P in the x and y directions, and the trace width is $w_2$. In general, the period of the conductive mesh 1504a and 1504b need not be the same as the period of the patches 1506 as shown here. The ground plane mesh may have a smaller or a larger period than the rest of the SWS. Furthermore, the buried ground plane in the multilayer ceramic substrate may be realized with a single conductive mesh layer 1504a. However, for the same period and line width, the two-layer meshed ground plane may have less RF loss associated with leakage into the ceramic substrate.

Figure 15:
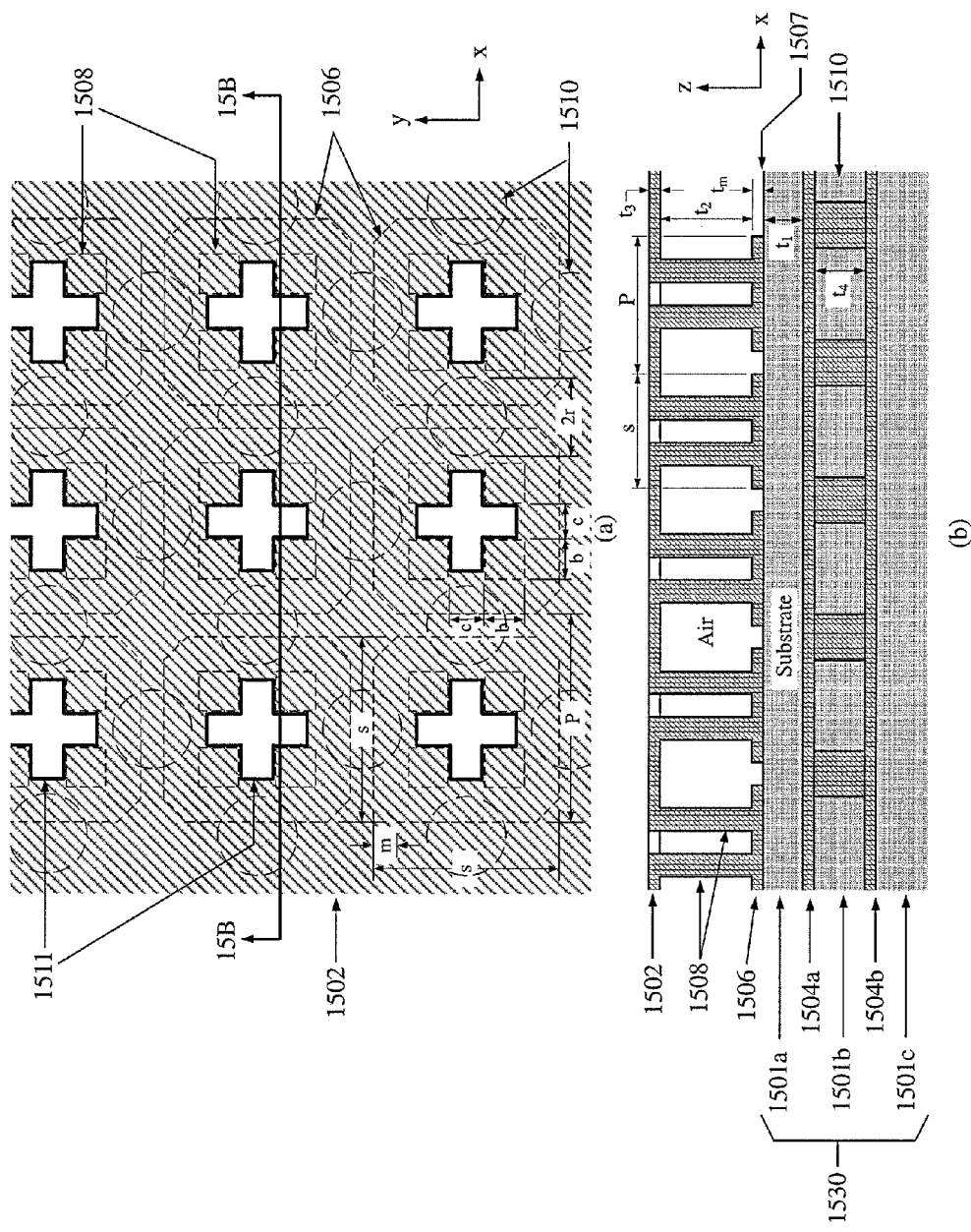
FIG. 15 shows another example in (a) a plan view, and (b) an elevation view where the SWS is integrated with a multilayer substrate.

Note that in the SWS example of FIGS. 15 and 16, the RF fields within the PPW propagate within the ceramic dielectric layer 1501a. Hence, the multilayer ceramic substrate is a part of the SWS.

In this example, the surface of the ceramic substrate 1507 may be polished to permit the conductive patches 1506 to be fabricated on a smooth ceramic surface. Fabricating the SWS on a multilayer ceramic substrate may allow for the integration of RF transitions or feeds between the SWS and other transmission lines integrated with the multilayer ceramic substrate. The feeds may include conductive probes that penetrate the PPW, coupling slots in the upper or lower ground plane that forms the PPW, or coupling loops that reside inside the PPW. Furthermore, the multilayer ceramic substrate 1530 may be the package so as to support integrated circuits mounted on the side opposite to the SWS.

A multilayer ceramic substrate may be used to achieve a thickness dimension $t_1$ that is thin (~100 um or less) such that the ratio of $t_2/t_1$ may be as high as possible, while other buried layers may be used, for example, as mechanical support. Reducing $t_1$ increases the effective dielectric constant $\gamma_{eff}$ for the SWS according to equation (9). The thickness dimension $t_1$ may be controlled, for example, by polishing the surface of the ceramic substrate.

An example of a two-dimensional SWS built on multilayer ceramic substrate is shown in FIG. 17, according to the design shown in FIGS. 15 and 16. A 3D view is shown in FIG. 17(a) where the ceramic dielectric layers are hidden to allow the two-layer meshed ground plane to be clearly seen. FIG. 17(a) shows a 3D slice of an infinite 2D SWS. The period is 300 um in the x and y directions for both the conductive obstacles (1506, 1508) as well as each layer of the meshed ground plane. The blind vias in the meshed ground plane may also be periodic, with a square lattice and a period of $P/\sqrt{2}$ or about 212 um. In the ceramic substrate, the via diameter is 90 um and the length is 100 um. Release holes 1511 have a cross shape and an overall size of 210 um in both x and y directions. The width of the release holes is 70 um and the thickness of the upper metal plate of the PPW, or depth of the release holes, is 50 um. Simulated results from a full-wave analysis of a finite-length TEM mode waveguide are shown in FIGS. 17(b), 17(c), and 17(d) for the Bloch mode propagating in the x or y directions. The effective permittivity shown in FIG. 17(c) has an initial value (low frequency limit) of about 18, which is more than 2 times greater than the permittivity of the ceramic layers themselves, which is about 7.1. The corresponding index of refraction is shown in FIG. 17(d).

Figure 18:
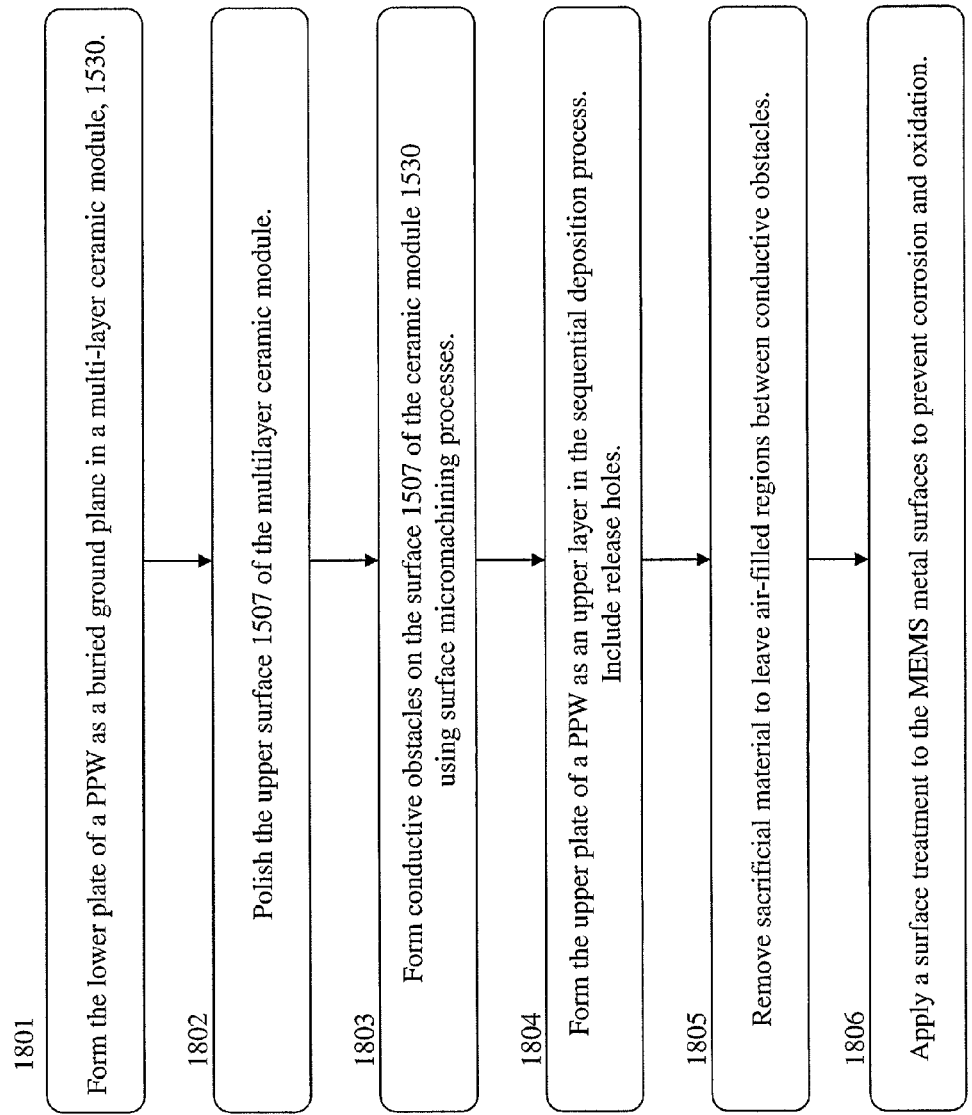
FIG. 18 represents a flow chart of a method for manufacturing a SWS using MEMS processes.

FIG. 18 shows a flowchart of a manufacturing method used to create a MEMS SWS that is integrated with a multilayer ceramic module as illustrated in FIG. 15. In step 1801 the lower plate of a PPW is formed as a buried ground plane inside a multilayer ceramic module 1530. This ground plane may be solid metal layer, a meshed metal layer, or even a plurality of meshed metal layers interconnected by conductive vias as illustrated by metal layers 1504a and 1504b in FIG. 15. In step 1802, a surface 1507 of the multilayer ceramic module 1530 may be polished or planarized to accommodate sequential deposition of conductive layers and sacrificial layers. This may be a mechanical process, a chemical process, or both. In step 1803, conductive obstacles are formed on the surface 1507 of the ceramic module 1530 using surface micromachining processes. This may involve the sequential deposition of patterned conductive material and sacrificial material layers. In this step, the shape and height of the conductive obstacles as well as the spacing between obstacles may be defined by process masks and the number of sequential depositions. In step 1804, the upper plate of the PPW may be formed as an upper conductive layer in the sequential deposition process. This upper layer of conductor may include release holes defined by the deposition of sacrificial material. In step 1805, the sacrificial material can be removed from all layers leaving air-filled regions between conductive obstacles. In step 1806, a surface treatment may be applied to prevent corrosion and oxidation of the MEMS metal structure. This treatment may be, for example, a plasma polymerization processes.

Figure 19:
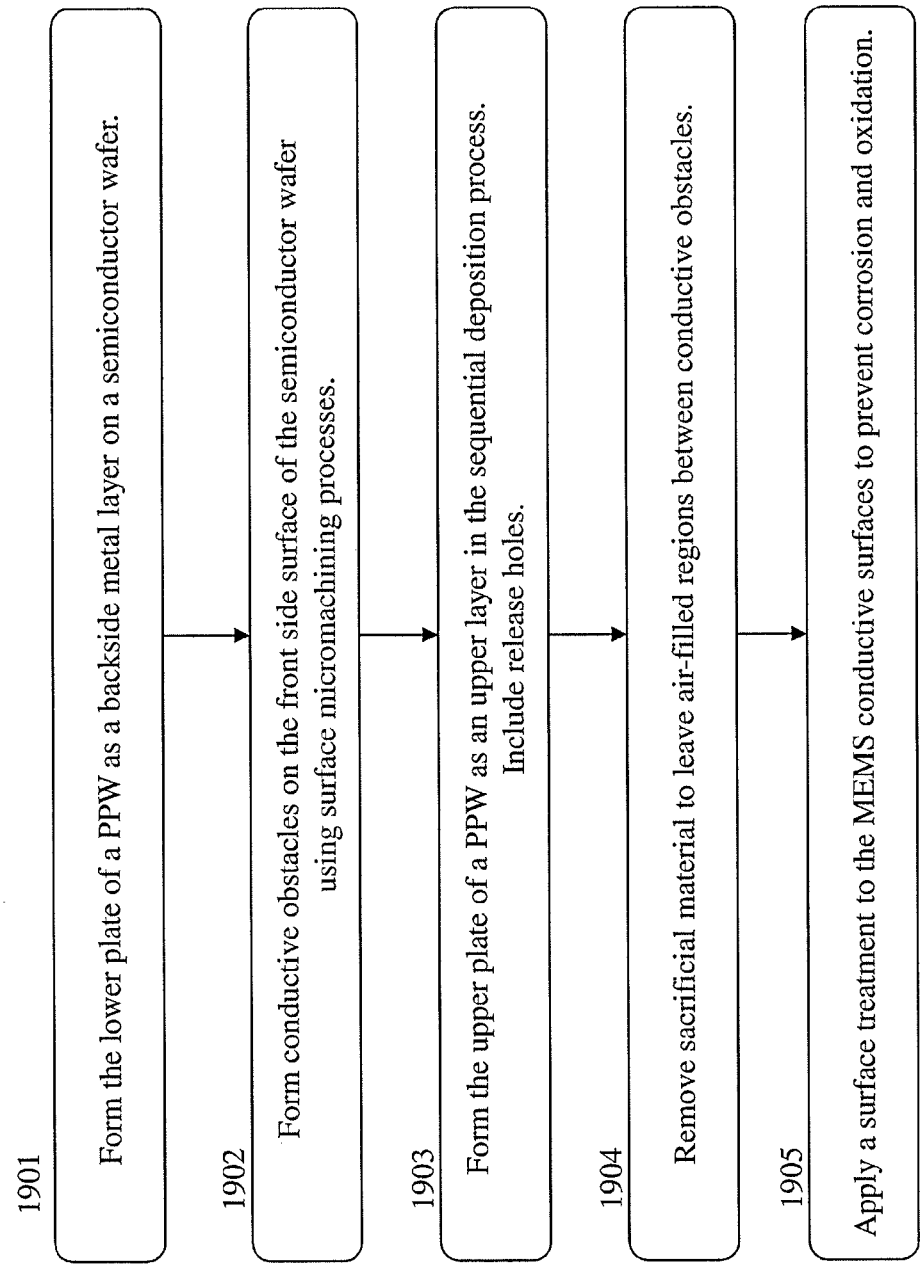
FIG. 19 represents a flow chart of another method for manufacturing a SWS using MEMS processes.

In a variation of the manufacturing method, the multilayer ceramic module 1530 may be replaced by a semiconductor wafer with a backside metal surface to produce the lower plate of a PPW as shown in FIGS. 10 and 12. FIG. 19 shows a flow chart of a manufacturing method that may be used to create a MEMS SWS integrated into a semiconductor wafer. In step 1901, the lower plate of a PPW is formed by depositing a metal layer (typically 0.5 um to 3 um thick) on the backside of the semiconductor wafer. In step 1902, conductive obstacles are formed on the front side of the semiconductor wafer using surface micromachining processes. This may involve the sequential deposition of patterned conductive material and sacrificial material layers. In this step, the shape and height of the conductive obstacles as well as the spacing between obstacles can be defined by process masks and the number of sequential depositions. In step 1903, the upper plate of the PPW may be formed as an upper conductive layer in the sequential deposition process. This layer of the conductor includes release holes defined by the deposition of sacrificial material. In step 1904, the sacrificial material can be removed leaving air-filled regions between conductive obstacles. In step 1905, a surface treatment may be applied to prevent corrosion and oxidation of the MEMS conductive structure.

Figure 20:
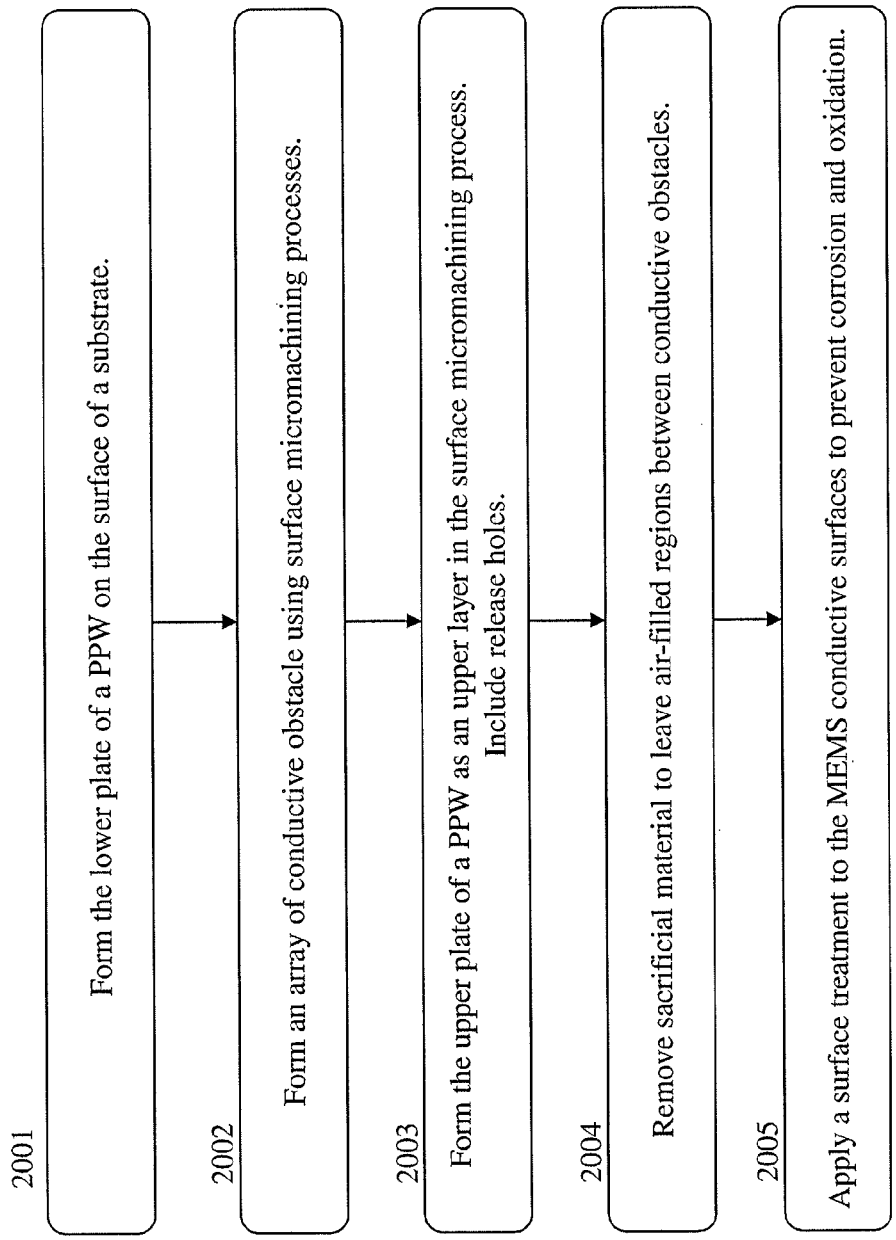
FIG. 20 represents a flow chart of another method for manufacturing a SWS using MEMS processes.

In another variation of the manufacturing method, the SWS may be fabricated on a substrate (including a ceramic or a semiconductor) with upper and lower plates of the PPW disposed above the substrate as shown in FIGS. 5, 6, 7 and 9. FIG. 20 shows a flow chart of the manufacturing method. In step 2001, the lower plate of a PPW is formed by depositing a conductive layer on the surface of the substrate to become the lower plate of the PPW. In step 2002, an array of conductive obstacles may be formed using a surface micromachining process. This may involve the sequential deposition of patterned conductive material and sacrificial material layers. In this step, the shape and height of the conductive obstacles as well as the spacing between obstacles may be defined by process masks and the number of sequential depositions. In step 2003, the upper plate of the PPW may be formed as an upper conductive layer in the sequential deposition process. This layer may include release holes defined by the deposition of sacrificial material. In step 2004, the sacrificial material may be removed from all layers leaving air-filled regions between conductive obstacles. In step 2005, a surface treatment may be applied to prevent corrosion and oxidation of the MEMS conductive structure.

The SWS examples shown in FIGS. 5, 6, 7, 9, 10, 12, and 15 are 2D periodic structures formed as a square lattice. The period and patch lengths are the same in the x and y directions. However, this is not a limitation, as dissimilar periods may be used in orthogonal directions. Dissimilar periods in the x and y direction will yield a different effective permittivity for Bloch modes propagating in orthogonal directions, particularly if the conductive obstacles are formed to be invariant with respect to x and y directions. This is a method to realize an anisotropic SWS. Also, square patches are not a limitation, as any polygonal or similar shape may be used. Furthermore, the periodic lattice need not be a square lattice, as rectangular, triangular, hexagonal, or other periodic or quasi-periodic lattices may be used to realize the SWS.

Release holes illustrated in the above examples have been shown as square or crossed shaped. This is not a limitation, as the release holes may take on any polygonal shape, or an equivalent irregular shape. Furthermore, the depth of the release holes may be increased by building up additional layers of conductor at least around the holes. This added depth of the walls of the release holes increases the length of the waveguide-operating-below-cutoff, which reduces the amount of electromagnetic energy that may leak from the release holes.

Figure 21:
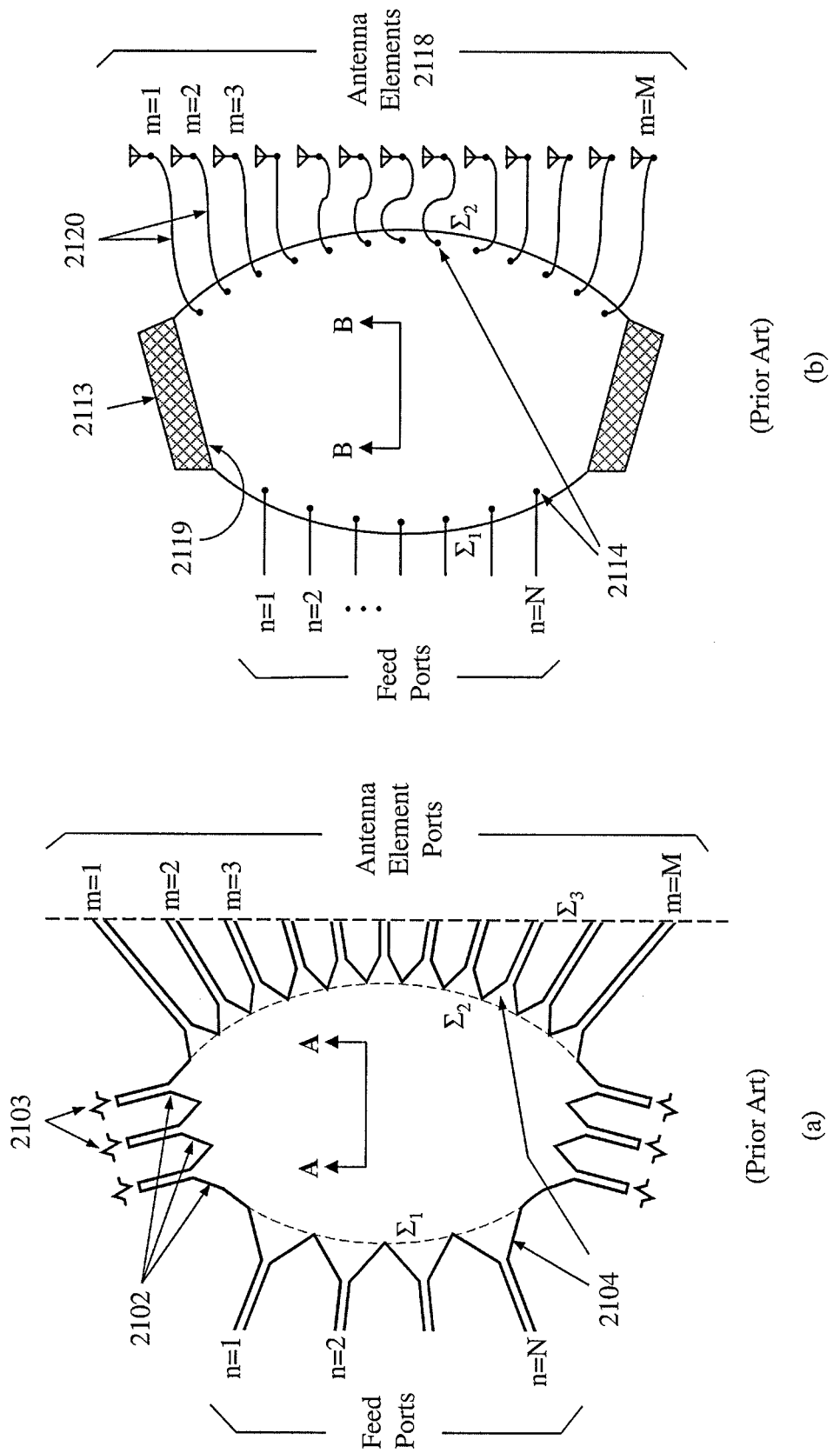
FIG. 21 shows plan views of generic Rotman lens (prior art)

Applications of these structures include, for example, all types of bootlace lens antenna beamformers, such as Rotman lenses, Shelton's symmetric lens [IEEE Trans. on Antennas and Propagation, Vol. AP-26, No. 4, July 1978], including variations outlined by Rappaport [Carey M. Rappaport, "Multifocal Bootlace Lens Design Concepts: a Review," IEEE Antennas and Propagation Intl. Symposium, 2005, Vol. 2B, pp. 39-42]. FIG. 21 shows plan views of a generic Rotman lens where section cuts A-A and B-B may be any of the elevation views discussed above including FIG. 3(a), 4(a), 4(b), 5(b), 6(b), 7(b), 9(b), 10(b), 12(b), or 15(b). Relative to an air-filled lens, the linear dimensions of the lens contours $\Sigma_1$ and $\Sigma_2$ may be reduced by the index of refraction of the SWS, and the area defined by the lens contours may be reduced by the square of the index of refraction. FIG. 21(a) shows tapered microstripline feed ports 2104, but probe feeds 2114 may also be used as shown in FIG. 21(b). FIG. 21(b) shows an alternative lens concept where the lens contours $\Sigma_1$ and $\Sigma_2$ may be conductive walls that terminate the PPW. Each probe 2114 may be, for example, a via or vertical post that extends into the PPW. FIG. 21(b) also includes a linear array of uniformly spaced antenna elements 2118 connected to the bootlace transmission lines 2120.

The side walls of a bootlace lens, or other structure, may be designed to absorb incident waves so as to improve the desired amplitude and phase distribution at the antenna element ports, or similar result. In FIG. 21(a), the sidewalls are formed with microstripline ports 2102 which may be terminated in ideally matched transmission lines where each line may be loaded with a lumped resistor 2103 or an absorbing material positioned on top of the microstriplines. Alternatively, in FIG. 21(b), the sidewalls 2119 of the bootlace lens may contain a region of the PPW which is filled with an absorbing material 2113. The index of refraction of the absorber 2113 may be selected to match the index of refraction of the lens, so that reflections at the lens sidewall may be reduced.

Figure 22:
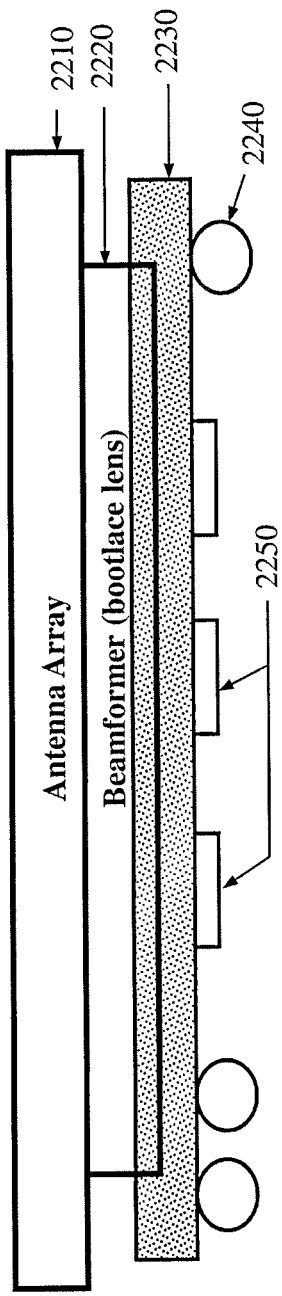
FIG. 22 shows an elevation view of a packaging concept for a microwave or millimeterwave (MMW) front end.

FIG. 22 is an elevation view of a package design that is suitable, for example, for a microwave or millimeterwave (MMW) front end for a transceiver, radar, or other sensor. The antenna array 2210 may be a MEMS structure fabricated using a sequential metal deposition processes as described above. This antenna array 2210 may be released from its host substrate and soldered to a beamformer 2220.

The beamformer 2220 may be fabricated as a MEMS SWS integrated with a multilayer ceramic module 2230, for instance as shown in FIG. 15(*b*). The bottom side of the multilayer ceramic module may contain solder balls 2240 for interconnects and integrated circuit chips 2250 for a receiver or transmitter or related RF functions. The beamformer 2220 may be built partly as a MEMS structure and partly as a ceramic structure. Fabricating part of the lens in multilayer ceramic permits integrating the RF interconnects for the beam ports into the ceramic module. The ceramic module 2230 may contain, for example, filters, matching networks, hybrids, baluns, or other RF signal processing components. Fabricating part of the beamformer as a MEMS structure offers options to simplify the RF interconnects to the MEMS based antenna array at the antenna ports. The integration of a miniaturized bootlace lens beamformer 2220 into the ceramic module 2230 may allow the ceramic module to remain relatively small in area while supporting antenna apertures of larger area. The MEMS antenna array 2210 may be physically larger than the footprint of the beamformer 2220, and even larger than the footprint of the ceramic module 2230.

A lossy, or absorptive, PPW may be used to reduce undesired reflections at selected sidewall locations inside a lens beamformer. Such a sidewall 2119 shown in FIG. 21(*b*). An absorptive PPW may be achieved by including a resistive loss mechanism in the upper, the lower, or in both conductive plates or surfaces of a PPW. The lossless SWS described above may be converted into absorptive SWS by replacing the lower conductive plate 1004 or 1204 with a uniform resistive film, or a patterned resistive film. A broad range of attenuation values can be achieved by controlling the effective resistivity of the film.

Figure 23:
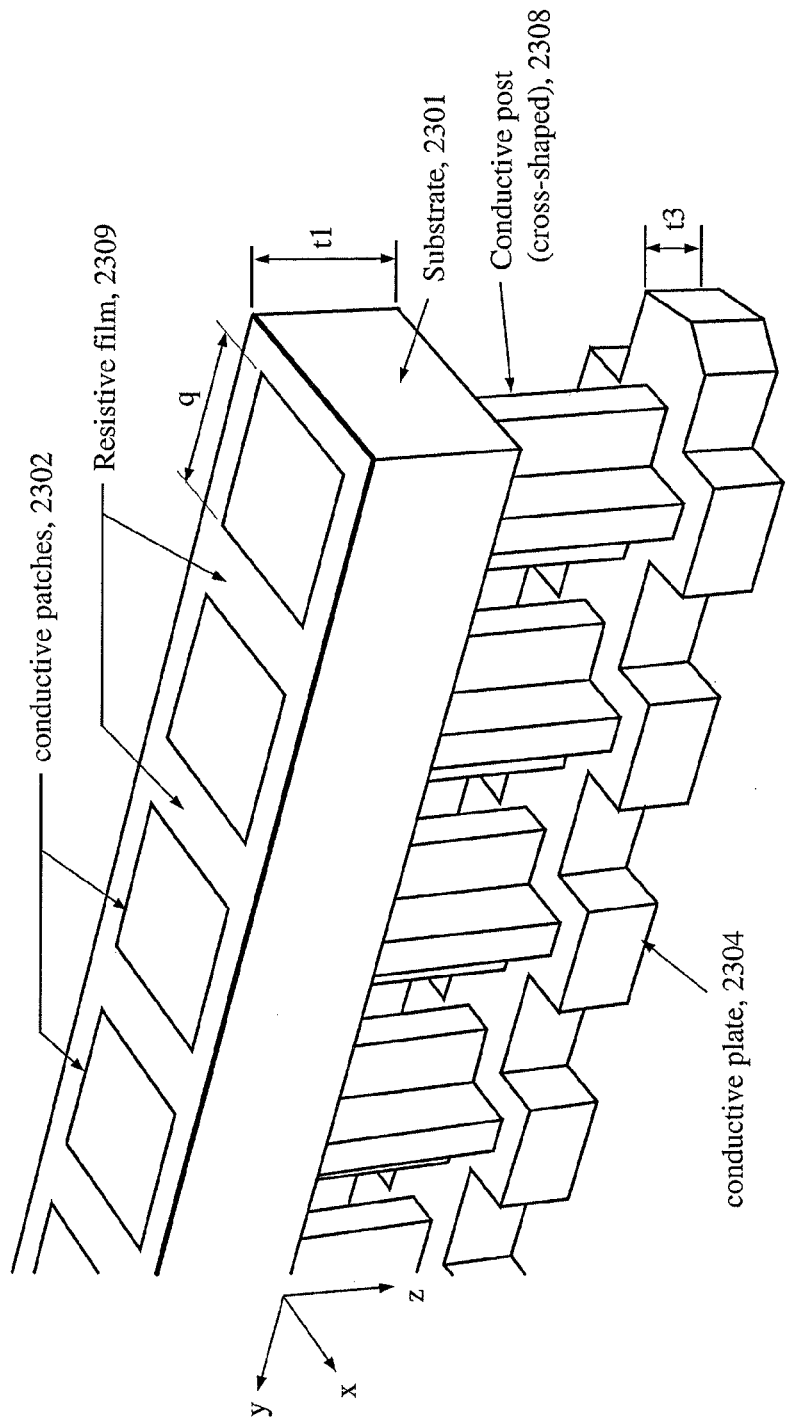
FIG. 23 shows an 3D perspective view of an absorptive SWS fabricated on a silicon substrate.

An example of an absorptive SWS, is shown in FIG. 23. This illustration is a 3D slice of the SWS shown in FIG. 12, where the lower conductive plate 1204 is replaced by a uniform, periodic two-dimensional array of thin square conductive patches 2302 of size q. The patches are formed on the bottom side of substrate 2301 of thickness t1. The center of each patch is aligned with the center of a corresponding conductive post 2308, which is cross shaped in this example. The gaps between the patches are bridged with a resistive film 2309. The SWS of FIG. 23 is drawn upside down relative to the SWS of FIG. 12(*b*) to reveal details of the conductive patches 2302 and resistive film 2309 that form the lower plate of the PPW. Although a linear array of unit cells is shown in FIG. 23, a two-dimensional array with a square periodic lattice for the SWS is assumed, as shown in FIG. 12(*a*).

Figure 24:
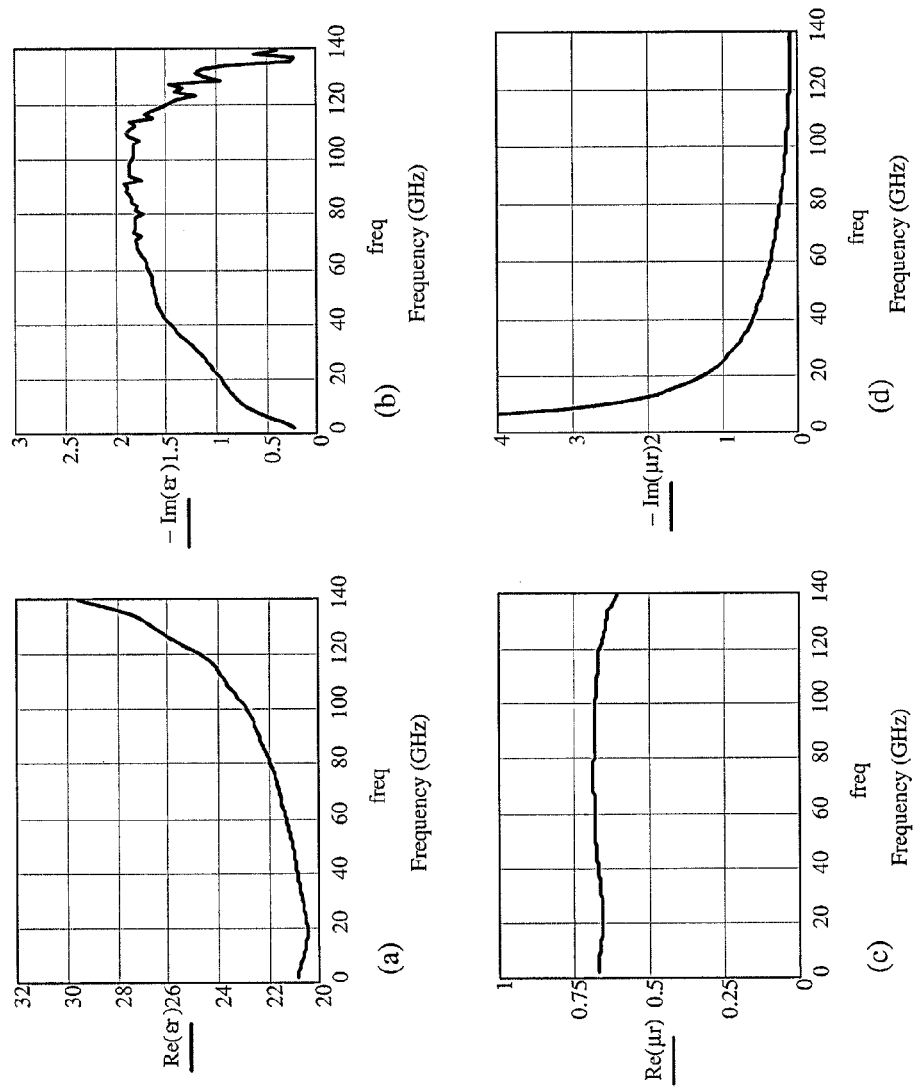
FIG. 24 shows the computed relative permittivity and relative permeability for the absorptive SWS of FIG. 23 where P=160 um, t1=100 um, t2=150 um, t3=50 um, a=25 um, bx=by=b=110 um, release holes are 80 um sq., patch size q=120 um, and resistive film value is 200 Ω/sq.

In another example, the absorptive SWS of FIG. 23 has a substrate of high resistivity Silicon of 1000 Ω-cm, a period P=160 um, and t1=100 um, t2=150 um (post height), t3=50 um, a=25 um, $b_x=b_y$=b=110 um, q=120 um; and, the resistive film has a value of 200 Ω/sq. The conductive posts 2308 and upper plate 2302 are formed from Cu. Two-port s parameters may be calculated for a finite length of this SWS modeled as a rectangular TEM mode waveguide, as previously discussed. The effective media parameters may be evaluated using a nonlinear optimization method described by James Baker-Jarvis, Richard Geyer, and Paul Domich in "Improved Technique for Determining Complex Permittivity with the Transmission/Reflection Method," *IEEE Trans. on Instrumentation and Measurement*, Vol. 38, No. 8, August 1990, which is incorporated herein by reference. The results are shown in FIG. 24. The real and imaginary parts of the effective relative permittivity are shown in FIGS. 24(*a*) and 24(*b*), respectively. The real and imaginary parts of the effective relative permeability are shown in FIGS. 24(*c*) and 24(*d*), respectively. The absorptive SWS of FIG. 23 exhibits both dielectric and magnetic loss since the imaginary components of $\in_{eff}$ and $\mu_{eff}$ are both nonzero. Finally, the transmission loss of the Bloch mode in this SWS can be calculated using the effective material parameters (of FIG. 24) and attenuation formulas published by W. B. Weir in "Automatic Measurement of Complex Dielectric Constant and Permeability at Microwave Frequencies," *Proceedings of the IEEE*, Vol. 62, No. 1, January 1974, pp. 33-36, which is incorporated herein by reference.

Figure 25:
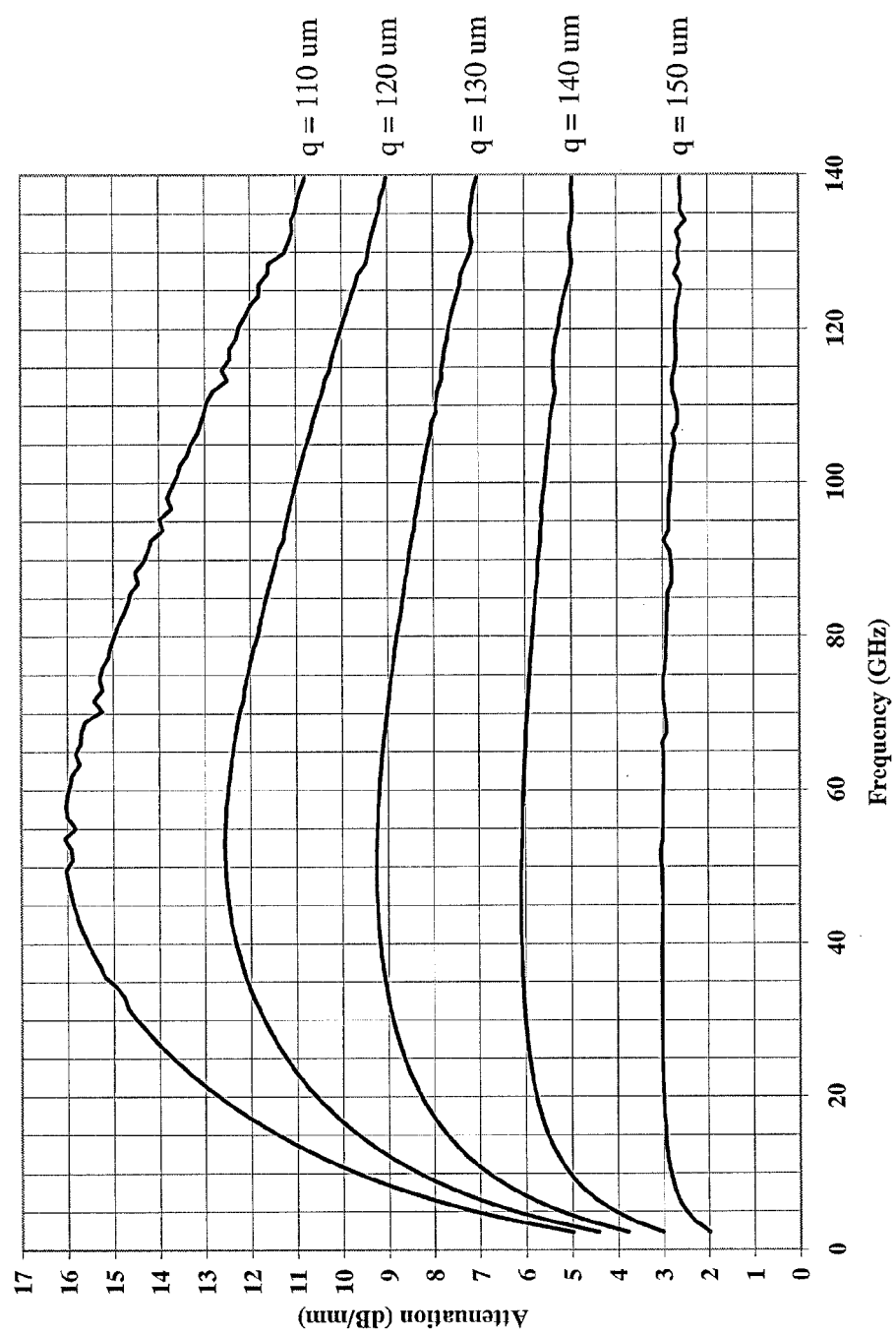
FIG. 25 shows computed attenuation curves as a function of frequency various patch sizes s for the absorptive SWS of FIG. 23 where the design parameters are defined for FIG. 24.

FIG. 25 shows the Bloch mode attenuation in dB/mm as a function of frequency for various patch sizes from 110 um up to 150 um. Note that, in these examples, the period is held constant at 160 um and the resistive film value is held constant at 200 Ω/sq. Attenuation is fairly constant over a multi-octave range of frequency, from at least about 20 GHz to about 100 GHz, for the three largest patch sizes. In addition, the value of attenuation may be controlled by adjusting the patch size. Therefore, attenuation can be made position dependent. Furthermore, a wide and useful range of attenuation is possible, from about 3 dB/mm to more than about 12 dB/mm, by adjusting the patch size q. Lower resistive film values will lower this range of attenuation.

Figure 26:
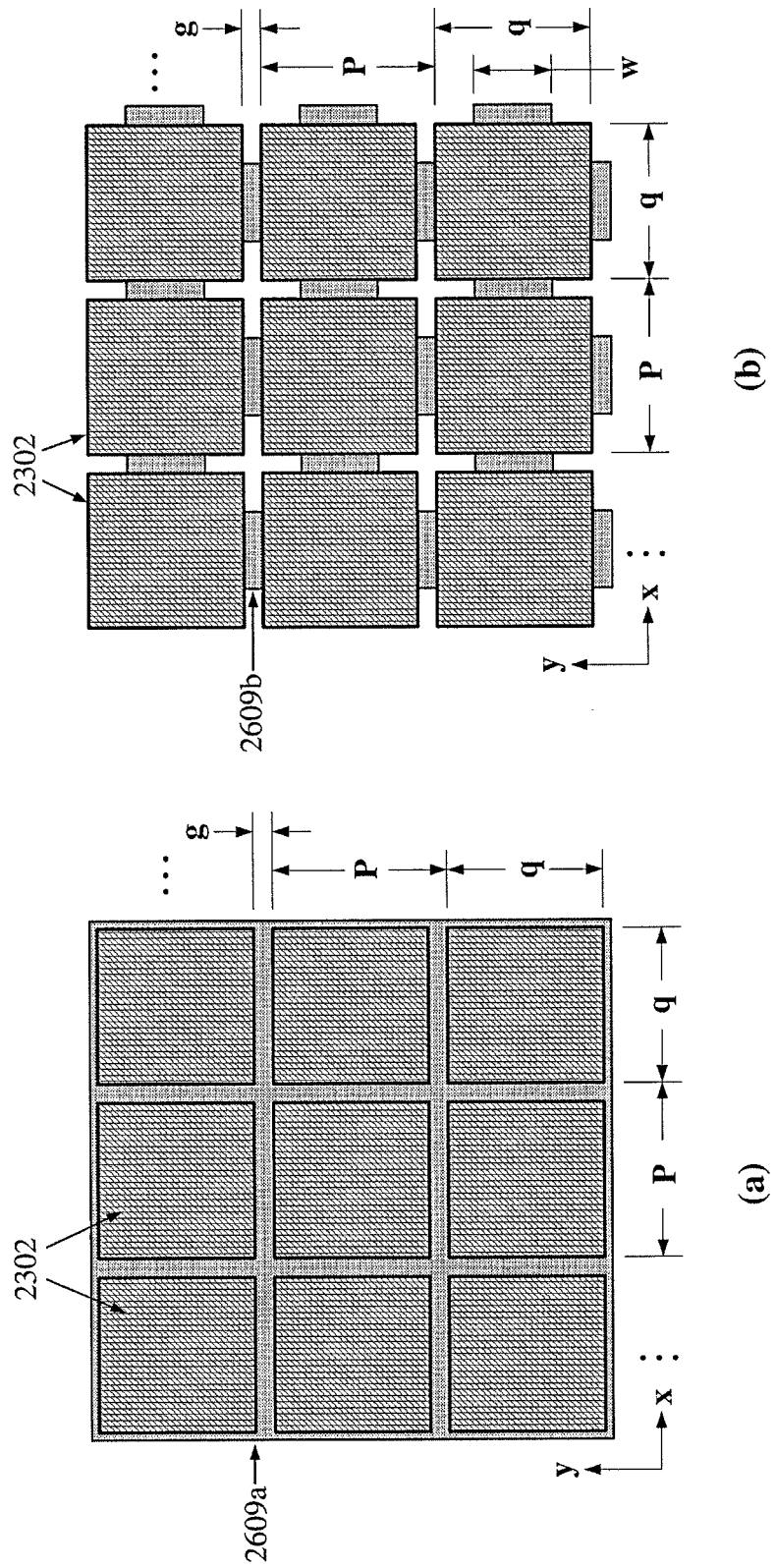
FIG. 26 shows plan views of the conductive patches and resistive film for the absorptive SWS example of FIG. 23. (a) continuous resistive film, (b) patterned resistive film.

FIG. 26 shows two of many possible examples of resistive film layouts used to form the lower plate of the PPW in the SWS of FIG. 23. FIG. 26(*a*) shows the case of a contiguous resistive film 2609*a* which fills all of the gaps between highly conductive patches 2302, as was described for the SWS shown in FIG. 23. Assuming the intrinsic resistance of the film is $R_{film}$, then the effective sheet resistance $R_{sheet}$ of the lower plate as shown in FIG. 26(*a*) is $$R_{sheet} = R_{film}\frac{g}{q} = R_{film}\frac{P-q}{q}. \quad (19)$$

FIG. 26(*b*) shows an alternative example where the resistive film 2609*b* is patterned such that the film resides in only a portion of the gap areas. The effective sheet resistance $R_{sheet}$ of the lower plate for this case is $$R_{sheet} = R_{film}\frac{g}{w} = R_{film}\frac{P-q}{w}. \quad (20)$$

Alternatively, the lower plate of the PPW may be a continuous sheet of resistive film, or a patterned sheet of resistive film, thereby omitting the array of highly conductive patches in this region. For a desired attenuation, a continuous sheet of resistive film would use a lower value of intrinsic $R_{film}$ than would be needed if the array of conductive patches had been included.

It may be helpful to understand the magnitudes of the resistances involved in the example designs. Using the example of the absorptive SWS of FIG. 23, assume the upper conductive plate 2302 is comprised of Cu whose conductivity σ is 5.8E7 S/m. The surface resistivity of Cu is defined to be R=1/(σδ), where the skin depth δ is defined as δ=1/$\sqrt{\pi f \mu_o \sigma}$. The surface resistivity of Cu increases with the square root of frequency to a value of 0.0309Ω at 140 GHz. Using equation (19), the effective sheet resistance varies from 13.3Ω/sq. up to 90.9 Ω/sq. for the five patch sizes shown in FIG. 25. Even the lowest value of effective sheet resistance employed for the lower conductive plate (13.3 Ω/sq.) is more than 430 times greater than the surface resistivity of the upper conductive plate, which is a good conductor. An absorptive SWS may be thus characterized as a PPW where at least one of the parallel surfaces contains a resistive loss mechanism exhibiting an effective sheet resistance at least about 100 times greater than the surface resistivity of a good conductor at the operating frequency. For the purposes of this description, a good conductor may be defined to have a bulk conductivity exceeding 3E8 S/m. This would include, for example, Al, Cu, and Ag.

Figure 27:
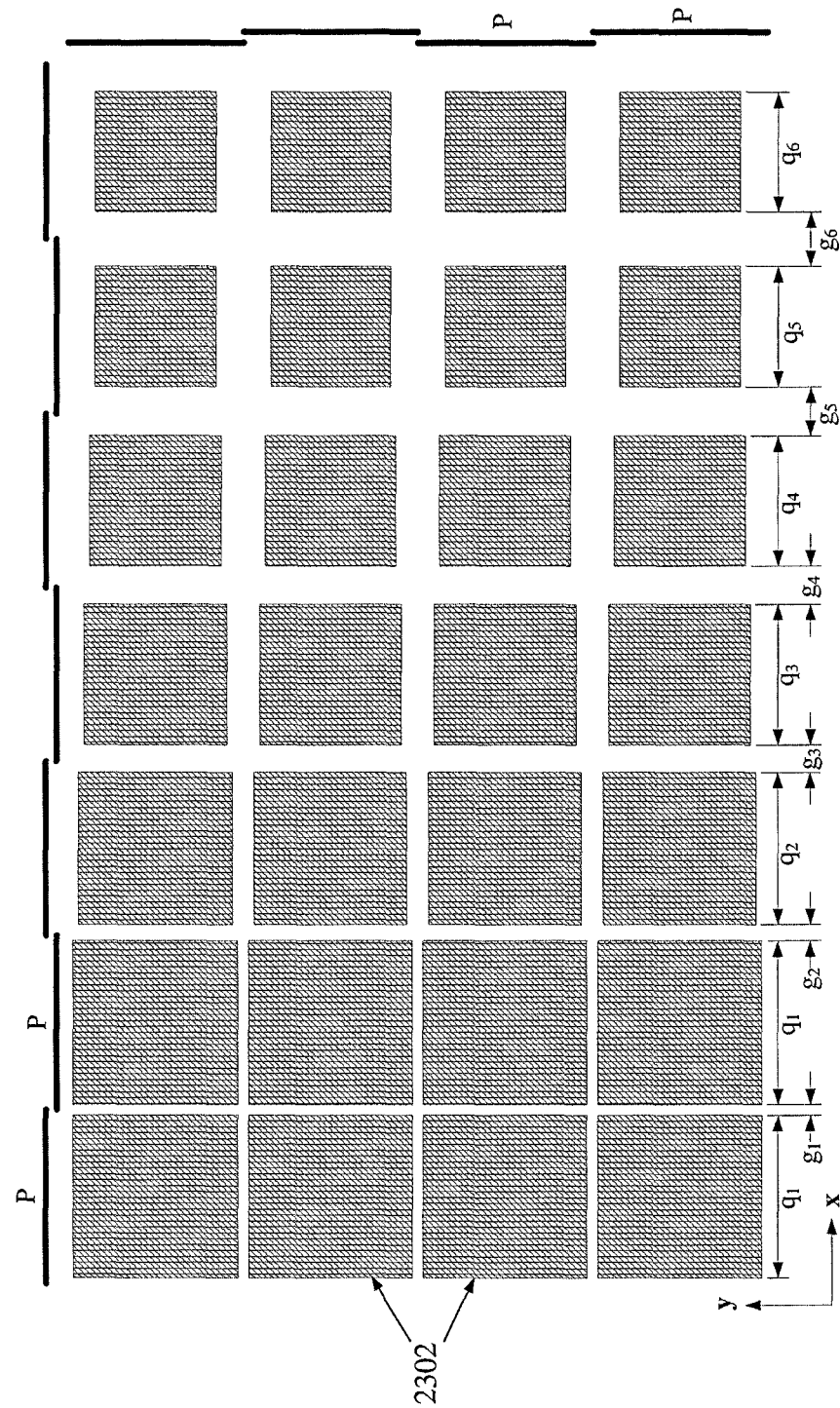
FIG. 27 shows a plan view of one example of a conductive patch array for the absorptive SWS of FIG. 23.

Whether or not the resistive film is patterned, the array of conductive patches may be configured to produce an inhomogeneous absorbing SWS. FIG. 27 shows a plan view of an inhomogeneous pattern of highly conductive patches 2306 on the bottom of the substrate that comprises a SWS similar to FIG. 23. This is the lower plate of the PPW. The square lattice of patches has a uniform period of P in both the x and y directions, as implied by the ruler at the top and right sides. However, the patch size varies from q1 to q6 as a function of position, but only in the x direction: q1>q2>q3>q4>q5>q6. Gaps between patches contain a uniform resistive film such that the larger patches have less resistance between them due to their smaller gap dimensions: g1<g2<g3<g4<g5<g6. For a wave traveling in the x direction, the attenuation per unit length increases with position from left to right in the figure. In a practical absorber application, the left side of FIG. 27 may transition into a lossless PPW region where the gaps are omitted in the lower plate of the PPW (an area with no isolated patches).

Another method of realizing an inhomogeneous absorptive SWS with a graded attenuation function is to form the resistive surface such that it has an array of uniform periodic conductive patches as shown in FIG. 26(b), and pattern the resistive film 2609(b) such that the width w is not constant, but it varies as a function of position. As w is decreased (assuming a constant gap dimension) with changes in position, then $R_{sheet}=R_{sheet}(x, y)$ will increase and the resulting attenuation will increase and be position dependent. In addition, uniform square patches with a non-uniformly patterned resistive film can be used to realize an anisotropic attenuation function. Assume that the resistive film between adjacent patches arrayed in rows has width $w_y$, and the width of the resistive film between patches arrayed in columns has width $w_x$. If, by design, $w_x>w_y$, then $R_{sheet}$ becomes dependent on the direction of RF current flow, and the attenuation for wave propagation directed along the columns of patches will be less than the attenuation for wave propagation directed along the rows of patches.

Figure 28:
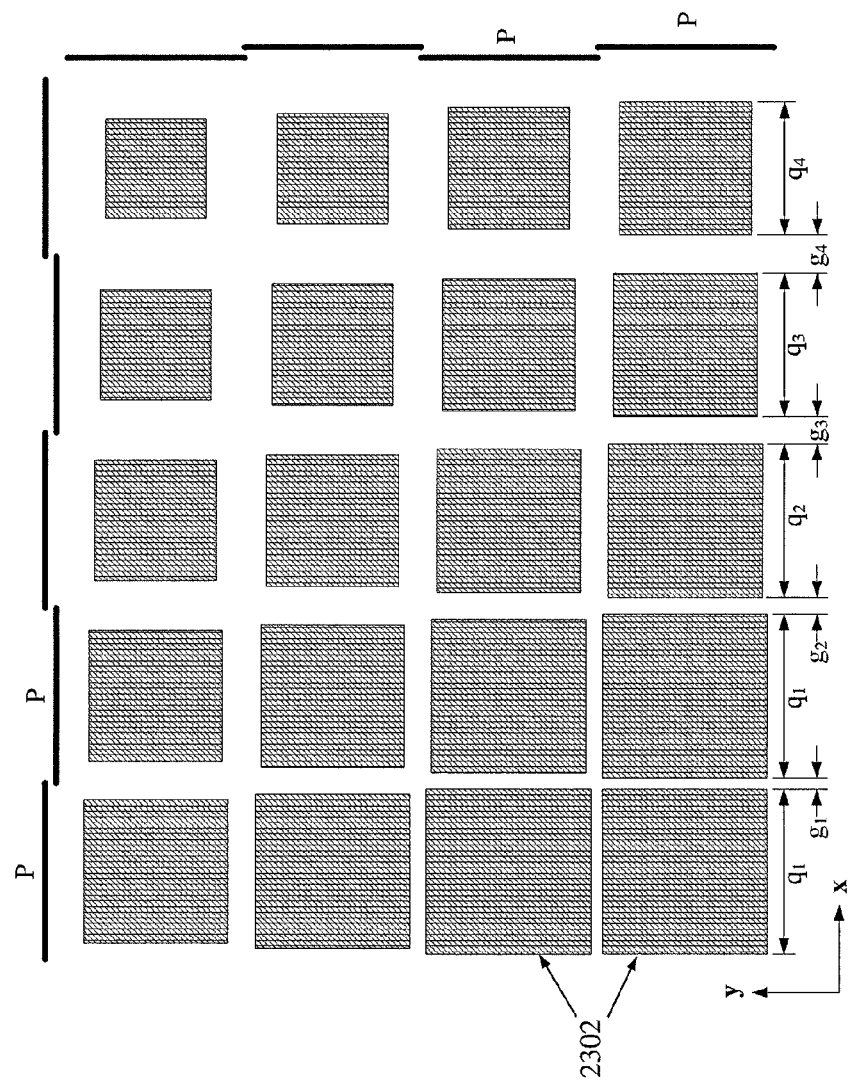
FIG. 28 shows another plan view of one example of a conductive patch array for the absorptive SWS of FIG. 23.

FIG. 28 shows a plan view of another inhomogeneous pattern of highly conductive patches on the bottom of the substrate that comprises a SWS similar to FIG. 23. The square lattice of patches have a uniform period of P in both the x and y directions. However, the patch size varies from q1 to q4 as a function of position along both the x and y directions: q1>q2>q3>q4. Gaps between patches contain a uniform resistive film such that the larger patches have less effective sheet resistance between them due to their smaller gap dimensions: g1<g2<g3<g4. For a wave traveling in the x or y directions, the attenuation per unit length increases with position going from left to right and from down to up in FIG. 28.

Figure 29:
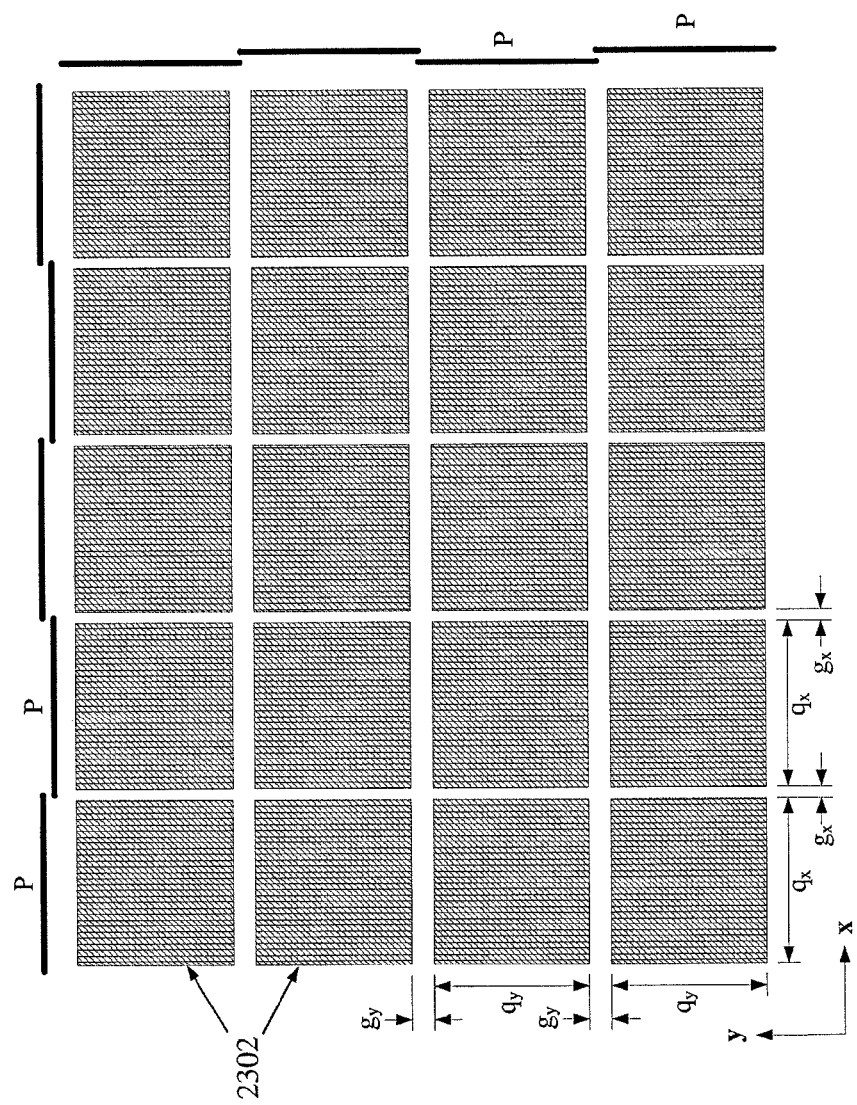
FIG. 29 shows another plan view of one example of a conductive patch array for the absorptive SWS of FIG. 23.

FIG. 29 shows a plan view of a patch array 2306 for an anisotropic absorbing SWS. The square lattice of patches has a uniform period of P in both the x and y directions. All patches are the same size. However, the patch shape is rectangular with size $q_x$ by $q_y$, where $q_x$ and $q_y$ are not equal. Gaps between patches may contain a uniform resistive film such that the uniform patches have a less effective sheet resistance between them in the x direction than in the y direction due to the smaller gap between the rows of patches as compared with the gap between the columns of patches: $g_x<g_y$. The attenuation per unit length is greater for waves traveling in the y direction than in the x direction because there is a higher effective sheet resistance between patches in the columns than between patches in the rows.

Figure 30:
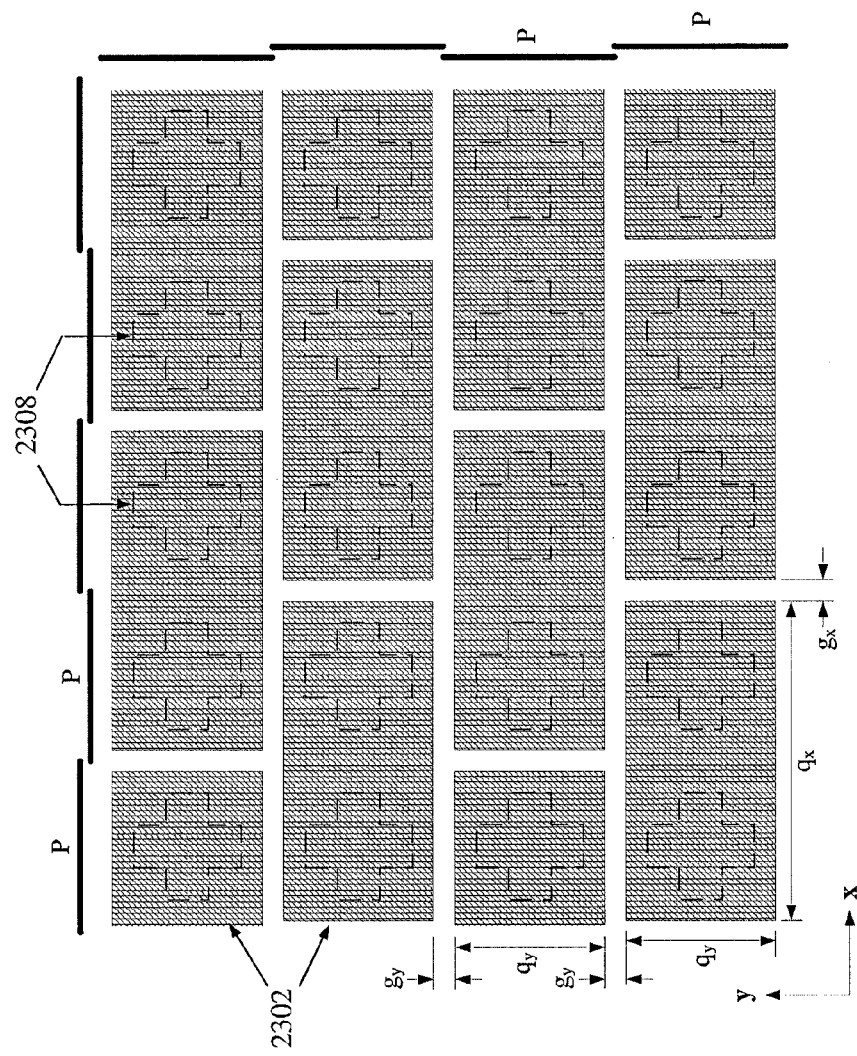
FIG. 30 shows another plan view of an example of a conductive patch array for the absorptive SWS of FIG. 23.

FIG. 30 shows a plan view of a patch array 2306 for another anisotropic SWS. Also shown is the square lattice of cross-shaped metal posts 2308 that have a uniform period of P in both the x and y directions. All patches are the same size. However, the patch shape is rectangular with size $q_x$ by $q_y$, where $q_x$ and $q_y$ are not equal, but have approximately a 2:1 ratio. Gaps between patches contain a uniform resistive film with a uniform gap width. The patches have less effective sheet resistance per unit length in the x direction than in the y direction due to their rectangular shape. The attenuation per unit length is greater for waves traveling in the y direction than in the x direction because there is a higher effective sheet resistance per unit length between patches in the y direction. Other aspect ratios for the patches could also be used, such as 3:1 or 4:1 for $q_x/q_y$.

The anisotropic absorptive SWS of FIG. 29 or FIG. 30 may be designed such that that the real part of the effective material parameters $\in_{eff}$ and $\mu_{eff}$ may be essentially isotropic (independent of wave propagation direction) while the imaginary part of the effective material parameters can be designed to be anisotropic (propagation direction dependent). The patterning of good conductors and resistive films used as upper or lower plates in the SWS permits control of the effective material parameters.

Figure 31:
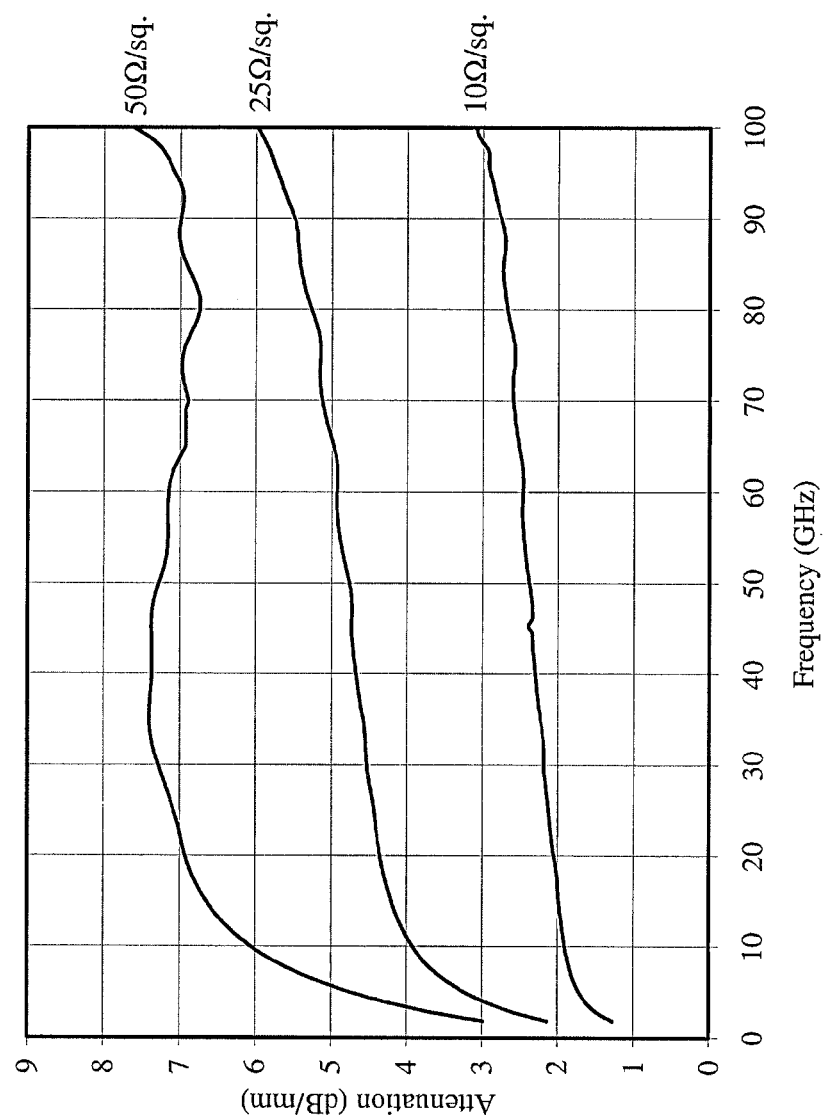
FIG. 31 shows computed attenuation curves as a function of frequency for various values of resistivity assuming the meshed lines 1504a and 1504b of FIG. 15 are resistive metal.

Absorptive SWS may also be produced using multilayer ceramic substrates where the resistive losses are incorporated into the buried ground plane. Consider the SWS of FIGS. 15 and 16. Assume that the highly conductive meshed layers 1504a and 1504b are replaced by a resistive material to form a resistive mesh. The vias 1510, patches 1506, posts 1508, and upper plate 1502 remain as a highly conductive metal. The same dimensions and substrate permittivity as defined in FIG. 17 are used in this example. A parametric study of resistive film values (10, 25, and 50 Ω/sq.) for the meshed lines 1504a and 1504b yields the attenuation curves of FIG. 31. This plot shows that attenuation is fairly constant over broad frequency ranges; attenuation increases as the value of the resistive film increases, and that the Bloch mode attenuation varies from about 2 dB/mm to about 7 dB/mm as the value of resistive film increases from 10 Ω/sq. to 50 Ω/sq. The attenuation will also increase as the width w1 and w2 of the meshed lines decreases. Therefore, an absorptive SWS with graded attenuation may be realized by fabricating meshed lines with a fixed resistivity and whose width varies as a function of position. Fabricating the meshed lines to have different widths in orthogonal directions will yield an anisotropic absorptive SWS, assuming the meshed lines have the same resistivity. Therefore, inhomogeneous and anisotropic absorptive SWS can be fabricated by editing the mask layouts for interior metal layers.

Resistive films may also be realized by a variety of technologies, including. thin film resistors or thick film resistors depending on the preferred manufacturing method. The materials used to realize resistive films can include carbon, polysilicon, nickel chromium (NiCr), tantalum nitride (TaN), ruthenium dioxide ($RuO_2$), bismuth ruthenate ($Bi_2Ru_2O_7$), and bismuth iridate ($Bi_2Ir_2O_7$). For some examples, resistances equivalent to resistive films can be realized with surface mounted technology (SMT), or as discrete resistors with wire leads.

The absorptive SWS examples have been described as MEMS structures with periods of 500 um or less. However, this size and method of fabrication is not a limitation of the SWS examples since they may be realized in larger form as printed circuit boards, or other manufacturing techniques, depending on the frequency range of operation.

Figure 32:
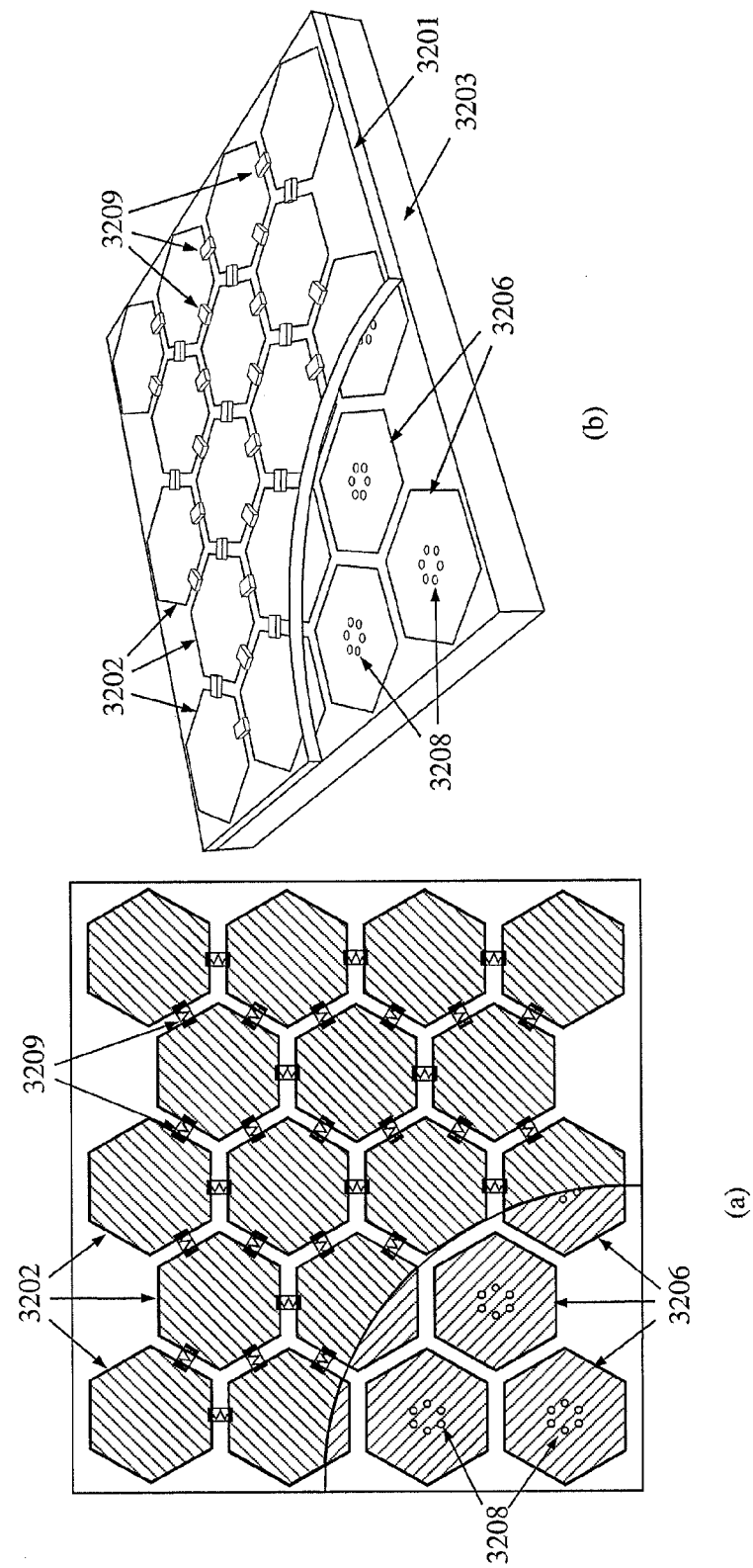
FIG. 32 shows a 3D perspective view of a printed circuit example of an absorptive SWS employing a triangular lattice of unit cells.

For example, the conductive upper plate 102 of the SWS shown in FIG. 3 may be replaced by a periodic array of isolated highly conductive patches, each located above the interior patches 106, where the exterior patches are interconnected across gaps by discrete surface mounted resistors. Thus, the upper plate 102 becomes an effective sheet resistance which may be engineered to have a wide range of resistance values ($\Omega$/sq.). This printed circuit SWS example is shown in FIG. 32 where conductive hexagonal patches 3202 form a triangular array on the upper surface of dielectric layer 3201. Surface-mounted chip resistors 3209 are soldered to the patches 3202 thereby interconnecting the patches to form an effective sheet resistance. Centered below the exterior patches 3202 are interior conductive patches 3206 printed on the upper surface of dielectric layer 3203. Patches 3202 and 3206 need not be the same size or the same shape, although they are shown to be so in FIG. 32. Conductive vias 3208 (e.g., plated through holes) electrically connect patches 3206 to a conductive plate 3204 (not shown) on the bottom side of dielectric layer 3203. Each patch 3206 and the associated cluster of vias 3208 form an internal-T resonant via. FIGS. 32(*a*) and 32(*b*) show a cutaway view at one corner where the dielectric layer 3201 and the upper plate 3202 are removed to reveal interior details.

Similarly, the upper and lower plates 402 and 404 of the SWS of FIG. 4 may be replaced by an array of conductive patches and discrete resistors or film resistors to realize an absorptive SWS. All of the resistive layer concepts illustrated in FIG. 26 through FIG. 30 may be fabricated using printed wiring board technology and applied to the SWS of FIGS. 1, 3 and 4(*a*). These absorptive SWS examples may be realized as printed wiring boards including organic laminates (such as woven fiberglass, polyimide, PTFE, liquid crystal polymer, or the like) or ceramic substrates (such as LTCC materials, Alumina, ceramic loaded organics, or the like), glass substrates, semiconductor substrates, or the like.

The examples illustrated above are two-dimensional (2D) SWS where the propagation direction may be in any lateral direction (in the xy plane). However, these SWS can also be fabricated as one-dimensional (1D) TEM mode transmission lines. Applications of 1D SWS include, for example, microwave and millimeterwave delay lines. 1D SWS of the type shown above can be incorporated into microwave components such as branch-line hybrids, rat-race hybrids, power dividers, attenuators, and multi-section matching transformers to reduce the physical length of their transmission lines, resulting in component miniaturization, potential cost or weight reduction, and higher levels of system integration.

The dielectric and conducting materials described in the above examples are representative of some typical applications for SWS. Many other material choices are possible, and the selection of materials is not considered a limitation. Dielectric materials for substrates may include semiconductors (Si, SiGe, GaAs, InP), ceramics (Al2O3, AlN, SiC, BeO) or ceramic composite materials including low temperature co-fired ceramic (LTCC) materials, and plastic materials such as liquid crystal polymer. Dielectric layers may also include organic laminates and laminates made from organic composites which may include ceramic particles, glass particles, and fiberglass. Metals may include (Al, Cu, Au, Ag, Pt, W, Mo), and metal alloys (FeNiCo (Kovar), FeNiAg (SILVAR), CuW, CuMo, Al/SiC) and many others. Non-metallic conductors such as conductive polymers may also be used. The conductive patches and posts may contain cross sectional shapes more elaborate than a simple square, such as circular or polygonal cross sections. Ratios of key dimensions may differ from illustrations presented in the figures.

The SWS in the above examples may use additional layers not shown to be compatible with manufacturing processes, or for other purposes, some of which may be functional or structural. For instance, thin adhesion layers of TiW may be used between a silicon or ceramic substrate and deposited metal such as Au, Cu, or Al. Insulating buffer layers may be added for planarization. Passivation layers or conformal coatings such as solder mask may be added to protect metal layers from oxidizing. Plasma polymerization processes may be used, for example, for corrosion protection and to enhance solderabilty. In printed circuit boards, bonding layers may be included. All of these additional manufacturing-process-related layers are typically thin with respect to the thicknesses of metal and dielectric layers shown in the figures describing this invention, and their impact may be viewed as a perturbation to the effective material parameters predicted by the above methods.

In the preceding figures only a finite number of unit cells are illustrated: fewer than 20 per figure. However a practical SWS may contain hundreds or even thousands of unit cells within a particular RF component or package. Alternatively, fewer cells may be used with some effect on the performance. Furthermore, it should be understood that all of the unit cells need not be identical in a particular SWS. The effective permittivity may be designed to have differing properties in various portions of the SWS, or conversely, the SWS may employ different unit cell designs that offer similar effective permittivity or similar index of refraction. There may also be SWS used in a given application that are isotropic in some locations and anisotropic in others. In some applications, such as beamforming lenses, it is desirable to employ both low-loss SWS and absorptive SWS in different areas of the same PPW.

Although only a limited number of exemplary examples of this invention have been described in detail above, those skilled in the art will readily appreciate that many modifications and combinations are possible in the exemplary examples without materially departing from the novel teachings and advantages of the invention. Accordingly, all such modifications and combinations are intended to be included within the scope of this invention as set forth in the following claims.

What is claimed is:

1. A slow wave electromagnetic structure, comprising:
   a pair of parallel plates, at least one of the pair of plates being a conductive material forming an electromagnetic waveguide; and
   a magneto-dielectric material comprising a periodic array of conductive obstacles in a host dielectric material disposed between the pair of parallel plates;
   an input port and an output port coupled by the slow wave structure over a passband operating frequency range; and
   wherein the conductive obstacles comprise one of an internal-T resonant via, an internal-I resonant via, or an internal double-T resonant via; and
   the properties of the magneto-dielectric material are selected to achieve an index of refraction of the slow wave structure of between approximately 2 and approximately 7 over the passband operating frequency range.

2. The slow wave structure of claim 1 wherein the input port or the output port is a tapered microstripline.

3. The slow wave structure of claim 1 wherein at the input port or the output port is a via or a vertical post extending into the waveguide.

4. The slow wave structure of claim 1, wherein a unit cell of the conductive obstacles comprises a multiplicity of vias.

5. The slow wave structure of claim 1, wherein unit cell dimensions of the conductive obstacles are different between two characteristic directions across the periodic array to achieve an anisotropic index of refraction.

6. The slow wave structure of claim 1, wherein a period of the conductive obstacles is different between two characteristic directions across the periodic array to achieve an anisotropic index of refraction.

7. The slow wave structure of claim 1, configured to form a portion of an antenna beamformer.

8. The slow wave structure of claim 1, wherein the periodic array is formed as a square, rectangular, triangular, or hexagonal lattice.

9. The slow wave structure of claim 1, wherein unit cell dimensions of the conductive obstacles vary with position to achieve a position dependent index of refraction.

10. The slow wave structure of claim 1, wherein a period of the conductive obstacles varies with position to achieve a position dependent index of refraction.

11. The slow wave structure of claim 1, wherein the conductive obstacles are formed in a printed wiring board.

12. A device comprising
   a pair of parallel plates, at least one of the pair of plates being a conductive material; and
   a magneto-dielectric material comprising an array of conductive obstacles disposed between the pair of parallel plates;
   wherein a first conductive plate comprises a first coplanar conductive mesh formed inside a ceramic substrate; and
   wherein the properties of the magneto-dielectric material are selected to achieve a desired index of refraction at an operating frequency.

13. The device of claim 12, wherein the conductive obstacles form a two-dimensional periodic array.

14. The device of claim 12, wherein a periodic array is formed as a square, rectangular, triangular, or hexagonal lattice.

15. The device of claim 12, wherein unit cell dimensions of the conductive obstacles vary with position to achieve a position dependent index of refraction.

16. The device of claim 12, wherein a period of the conductive obstacles varies with position to achieve a position dependent index of refraction.

17. The device of claim 12, wherein unit cell dimensions of the conductive obstacles is different between two characteristic directions across a periodic array to achieve an anisotropic index of refraction.

18. The device of claim 12, wherein a period of the conductive obstacles is different between two characteristic directions across a periodic array to achieve an anisotropic index of refraction.

19. The device of claim 12, wherein the conductive obstacles are formed in a printed wiring board.

20. The device of claim 12, wherein a multiplicity of vias in a given unit cell are arranged in a circular or polygon layout.

21. The device of claim 12, configured to form a portion of an antenna beamformer.

* * * * *